(12) United States Patent
Chen et al.

(10) Patent No.: US 8,135,485 B2
(45) Date of Patent: Mar. 13, 2012

(54) OFFSET CORRECTION TECHNIQUES FOR POSITIONING SUBSTRATES WITHIN A PROCESSING CHAMBER

(75) Inventors: Jack Chen, Fremont, CA (US); Andrew D. Bailey, III, Pleasanton, CA (US); Ben Mooring, Austin, TX (US); Stephen J Cain, Travis, TX (US)

(73) Assignee: Lam Research Corporation, Fremont, CA (US)

( * ) Notice: Subject to any disclaimer, the term of this patent is extended or adjusted under 35 U.S.C. 154(b) by 571 days.

(21) Appl. No.: 12/237,155

(22) Filed: Sep. 24, 2008

(65) Prior Publication Data

US 2009/0088887 A1 Apr. 2, 2009

Related U.S. Application Data

(60) Provisional application No. 60/976,338, filed on Sep. 28, 2007.

(51) Int. Cl.
| | |
|---|---|
| *H01L 21/00* | (2006.01) |
| *G06F 19/00* | (2006.01) |
| *G05B 19/418* | (2006.01) |
| *G05B 15/00* | (2006.01) |
| *B44C 1/22* | (2006.01) |
| *G06K 9/00* | (2006.01) |

(52) U.S. Cl. ............ 700/114; 438/6; 700/108; 700/117; 700/121; 700/171; 700/245; 700/248; 700/275; 216/37; 382/153

(58) Field of Classification Search ...... 438/6; 700/108, 700/114, 117, 121, 171, 245, 248, 275; 216/37; 382/153, 6

See application file for complete search history.

(56) References Cited

U.S. PATENT DOCUMENTS 4,860,229 A * 8/1989 Abbe et al. ............... 702/167
5,399,229 A    3/1995 Stefani et al.
(Continued)

FOREIGN PATENT DOCUMENTS

EP    1642690 A2 *  4/2006
(Continued)

OTHER PUBLICATIONS

Shichang et al., "Study of Wafer Pre-Aligning Approaches", 2007, High Technology Letters, vol. 13, No. 3, p. 267-272.*

(Continued)

*Primary Examiner* — Albert Decady
*Assistant Examiner* — Thomas Stevens
(74) *Attorney, Agent, or Firm* — IP Strategy Group, P.C.

(57) ABSTRACT

A method for aligning a substrate to a process center of a support mechanism is provided. The method includes determining substrate thickness after substrate processing at a plurality of orientations and at a plurality of radial distances from a geometric center of the substrate. The method also includes deriving a set of process rate values from substrate thickness and process duration. The method further includes creating for a process rate an off-centered plot, which represents a substantially concentric circle whose points are a circumference of the off-centered plot having substantially the first process rate. The method yet also includes applying a curve-fitting equation to the off-centered plot to determine a set of parameters. The method yet further includes teaching a set of robot arms the set of parameters, thereby enabling the set of robot arms to align another substrate that is supported by the support mechanism with the process center.

19 Claims, 24 Drawing Sheets

U.S. PATENT DOCUMENTS

| | | | | |
|---|---|---|---|---|
| 5,696,687 A * | 12/1997 | DeMotte et al. | | 700/114 |
| 5,706,201 A * | 1/1998 | Andrews | | 700/108 |
| 5,807,761 A | 9/1998 | Coronel et al. | | |
| 5,812,362 A * | 9/1998 | Ravi | | 361/234 |
| 5,862,057 A | 1/1999 | Xia et al. | | |
| 6,294,466 B1 * | 9/2001 | Chang | | 438/680 |
| 6,704,920 B2 * | 3/2004 | Brill et al. | | 716/53 |
| 6,890,774 B2 * | 5/2005 | Flanner et al. | | 438/14 |
| 7,361,906 B2 * | 4/2008 | Ghosh et al. | | 250/458.1 |
| 7,479,236 B2 * | 1/2009 | Chen et al. | | 216/59 |
| 7,486,878 B2 * | 2/2009 | Chen et al. | | 396/5 |
| 7,713,889 B2 * | 5/2010 | Hirukawa | | 438/800 |
| 7,751,922 B2 * | 7/2010 | Hirano et al. | | 700/112 |
| 2002/0133256 A1 * | 9/2002 | Nishihata et al. | | 700/117 |
| 2003/0010454 A1 * | 1/2003 | Bailey et al. | | 156/345.49 |
| 2003/0049372 A1 * | 3/2003 | Cook et al. | | 427/248.1 |
| 2003/0085115 A1 * | 5/2003 | Tani et al. | | 204/192.13 |
| 2004/0081547 A1 * | 4/2004 | Suh et al. | | 414/811 |
| 2004/0182698 A1 * | 9/2004 | Feltsman | | 204/298.11 |
| 2004/0199291 A1 * | 10/2004 | Freeman et al. | | 700/258 |
| 2005/0137751 A1 * | 6/2005 | Cox et al. | | 700/245 |
| 2005/0202677 A1 * | 9/2005 | Hsu et al. | | 438/692 |
| 2006/0067606 A1 * | 3/2006 | Towle et al. | | 385/14 |
| 2006/0141795 A1 | 6/2006 | Negishi et al. | | |
| 2007/0015296 A1 * | 1/2007 | Price | | 438/14 |
| 2007/0037301 A1 | 2/2007 | Jekauc | | |
| 2007/0209684 A1 | 9/2007 | Chen et al. | | |
| 2007/0211241 A1 | 9/2007 | Aizawa et al. | | |
| 2008/0080845 A1 * | 4/2008 | Chen et al. | | 396/4 |
| 2008/0081383 A1 | 4/2008 | Chen et al. | | |

FOREIGN PATENT DOCUMENTS

| | | | |
|---|---|---|---|
| KR | 10-2004-0037279 A | 5/2004 | |
| KR | 10-2006-0045327 A | 5/2006 | |

OTHER PUBLICATIONS

"International Preliminaoy Report on Patentability", Issued in PCT Application No. PCT/US2008/078145; Mailing Date: Apr. 8, 2010.
"International Search Report", Issued in PCT Application No. PCT/US2008/078145; Mailing Date: Jul. 15, 2009.
"Written Opinion", issued in PCT Application No. PCT/US2008/078145; Mailing Date: Jul. 15, 2009.
"International Search Report", PCT Application No. PCT/US07/78576; Mailing Date: Aug. 7, 2008.
"Written Opinion", PCT Application No. PCT/US07/78576; Mailing Date: Aug. 7, 2008.
"International Search Report", PCT Application No. PCT/US07/78578; Mailing Date: Aug. 8, 2008.
"Written Opinion", PCT Application No. PCT/US07/78578; Mailing Date: Aug. 8, 2008.
International Preliminary Report on Patentability PCT Application No. PCT/US07/78576; Mailing Date: Apr. 9, 2009.
"International Preliminary Report on Patentability", PCT Application No. PCT/US07/78578; Mailing Date: Apr. 9, 2009.
"Ex Parte Quayle Action", U.S. Appl. No. 11/612,370, Mailing Date: May 29, 2008.
"Notice of Allowance and Fees Due", U.S. Appl. No. 11/612,355; Mailing Date: Aug. 18, 2008.
"First Office Action", Chinese Patent Application No. 200780036424.1; Mailing Date: Jun. 17, 2010.

* cited by examiner

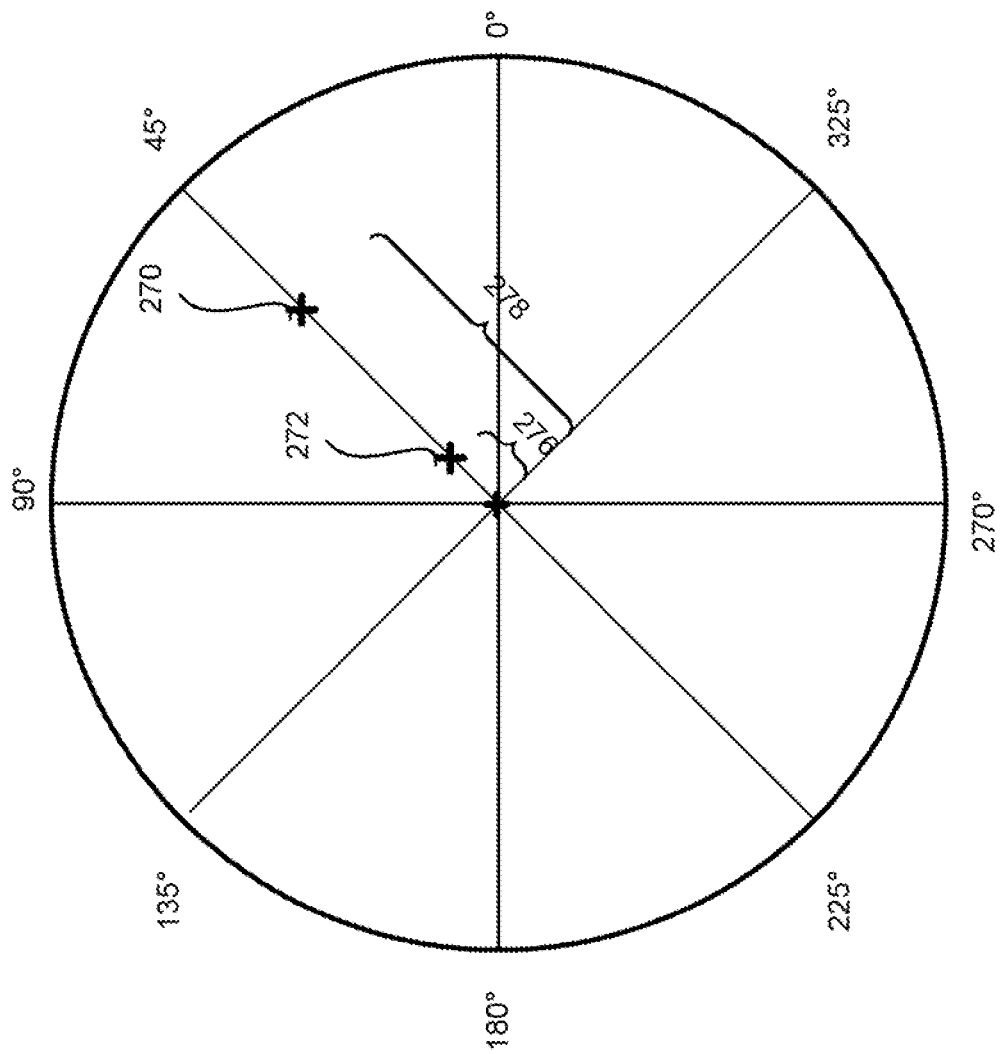
FIGURE 2C

OFFSET CORRECTION TECHNIQUES FOR POSITIONING SUBSTRATES WITHIN A PROCESSING CHAMBER

CROSS-REFERENCE TO RELATED APPLICATIONS

This application is related to and claims priority under 35 U.S.C. §119(e) to a commonly assigned provisional patent application entitled "Offset Correction Techniques For Positioning Substrates Within a Processing Chamber," by Chen et al., application Ser. No. 60/976,338, filed on Sep. 28, 2007, which is incorporated by reference herein.

The present invention is related to the following applications, all of which are incorporated herein by reference.

Commonly assigned application entitled "Offset Correction Techniques for Positioning Substrates," by Chen et al, application Ser. No. 11/612,355, now U.S. Pat. No. 7,479,236, filed on Dec. 18, 2006; and Commonly assigned application entitled "Offset Correction Methods and Arrangement for Positioning and Inspecting Substrates," by Chen et. al., application Ser. No. 11/612,370, now U.S. Pat. No. 7,486,878, filed on Dec. 18, 2006.

BACKGROUND OF THE INVENTION

Advances in plasma processing have facilitated growth in the semiconductor industry. Generally speaking, a plurality of semiconductor devices may be created from dies cut from a single processed substrate. To process a substrate, the substrate may be placed on top of a substrate chuck within a plasma processing chamber. The positioning of the substrate on the substrate chuck may determine which portion of the substrate may be processed to form devices.

Methods are available for aligning a substrate to the center of a substrate chuck. In an example, sensors may be placed in a processing module to determine the positioning of a substrate in regard to a substrate chuck. In another example, an alignment fixture, such as a guided robotic arm may be employed to position the substrate in alignment with the substrate chuck. Although aligning to a hardware center (e.g., center of the substrate chuck) may be performed with some precision, alignment to the hardware center may not always equate to an alignment to the process center.

As discussed herein, the hardware center refers to the center of a hardware such as a support mechanism (e.g., substrate chuck). Also as discussed herein, the process center refers to the focal center of the plasma process. Ideally, at any given radial distance from the focal center, the process result (e.g., the etch rate) remains the same. For example, at a distance of 100 mm from the process center, it is expected that the etch rate remains substantially constant as one follows around a circle having a radius of 100 mm from this focal process center. Due to chamber configuration peculiarities, the process center may not always be the same as the hardware center. As a result, basing alignment on the hardware center alone may cause misalignment during substrate processing. As manufacturers continue to strive to improve yield, efforts are continually made to more precisely center the substrate over the process center during plasma processing to minimize device defect caused by substrate misalignment.

BRIEF SUMMARY OF THE INVENTION

The invention relates, in an embodiment, to a method for aligning a substrate to a process center of a support mechanism, wherein the process center representing a focal center for processing the substrate in a plasma processing chamber. The method includes determining a plurality of thickness values for the substrate after substrate processing at a plurality of orientations and at a plurality of radial distances from a geometric center of the substrate. The method also includes deriving a set of process rate values from the plurality of thickness values and a process duration. The method further includes creating an oil-centered plot for a first process rate of the set of process rate values, wherein the off-centered plot represents a substantially concentric circle whose points on a circumference of the off-centered plot having substantially the first process rate. The method yet also includes applying a curve-fitting equation to the off-centered plot to determine a set of parameters for offsetting the substrate in relation to the support mechanism. The method yet further includes teaching a set of robot arms the set of parameters, thereby enabling the set of robot arms to align another substrate that is supported by the support mechanism with the process center of the support mechanism when the set of robot arms positions the another substrate in the plasma processing chamber for processing.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2C shows, in an embodiment, a radius measurement for each data point.

DETAILED DESCRIPTION OF EMBODIMENTS

Figure 1:
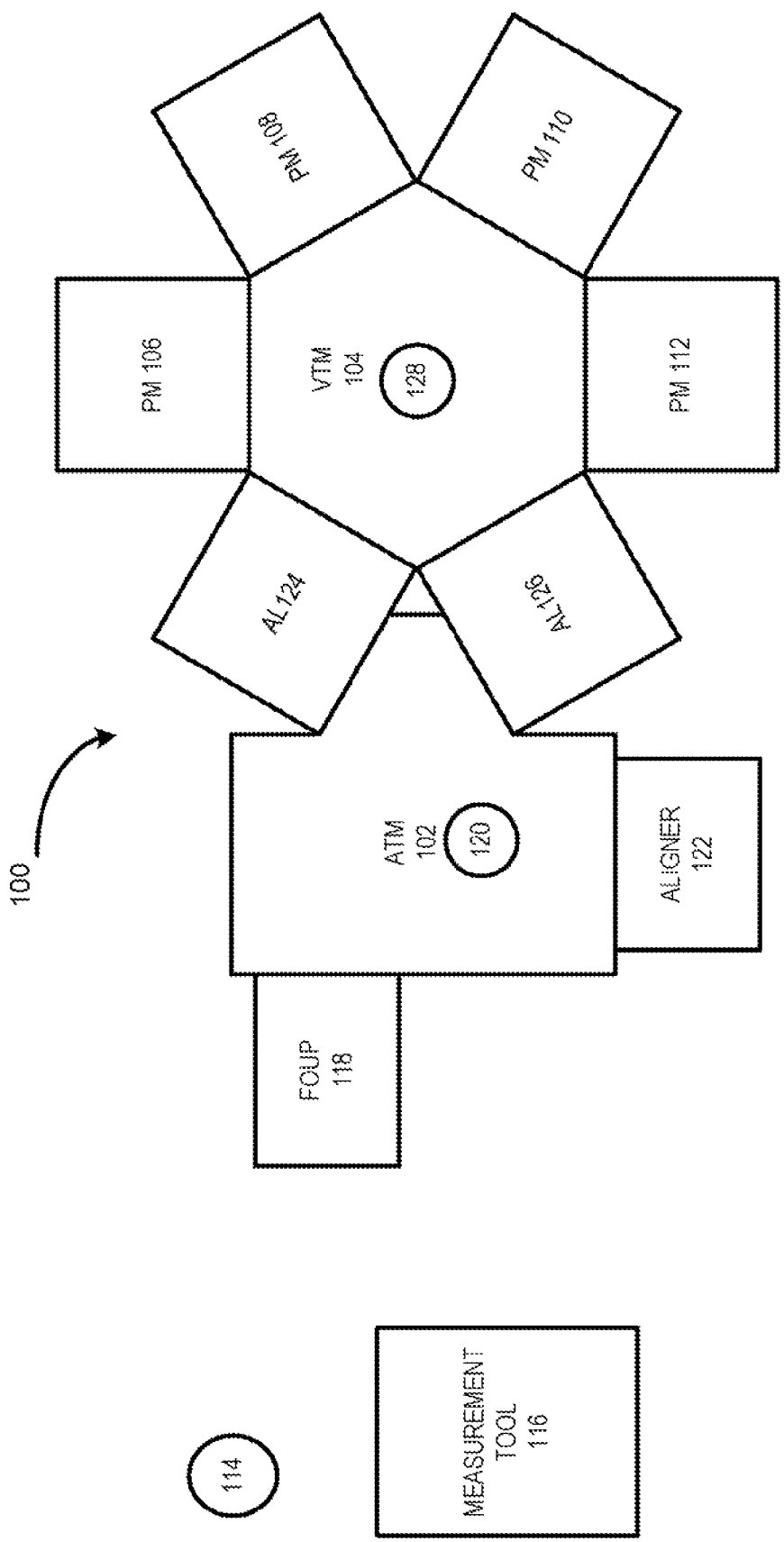
FIG. 1 shows, in an embodiment, a block diagram of an overview of a typical substrate process system.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for earning out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In the following disclosure, etching is discussed as the application for which the centering techniques can be employed to improve, it should be kept in mind, however, that the centering techniques disclosed herein can apply to any other type of processing (such as, for example, deposition and cleaning). Further, this technique is applicable for any application where the process is substantially concentric (uniform and/or non-uniform).

In accordance with embodiments of the present invention, there is provided a circular constant etch rate method for calculating the process center for a substrate chuck of a processing chamber, in embodiments of the invention, a substrate offset (i.e., the offset from the chuck's hardware center to the chuck's process center) may be inferred from etch rate measurements made on a test substrate that has been geometrically centered over the chuck during processing. With the calculated substrate offset, a robotic arm within a transfer module may be programmed with the coordinates of the chuck's process center to facilitate centering of subsequent substrates over the chuck's process center to enable processing with improved uniformity.

Generally, a robotic arm may be employed to place a substrate on the hardware center of a substrate chuck. However, as mentioned above, the hardware center and the process center may not always be the same due to peculiarities of a given tool. If the substrate can be more accurately centered on the process center, process uniformity is improved, rendering it possible to obtain satisfactory process results closer to the substrate edge and to use more of the substrate to create dies for devices. In the prior art, the method of alignment using hardware center may be an open loop alignment, which usually does not allow for feedbacks of offset signal. Unlike the prior art, the method of employing process center enables a close loop feedback of the substrate position, thus allowing for the control of the process center.

Embodiments of the invention provide a method for determining a process center by extrapolating data from a set of measurements made on a substrate that has been geometrically centered over the chuck's hardware center during processing. In an embodiment, a set of pre-processing measurement data points for a substrate may be collected prior to processing. In an embodiment, a set of post-processing measurement data points for the measurement locations on the same substrate may be collected after processing.

By calculating the difference between the pre and post-processing measurements for each data point, the amount of a film layer that has been removed may be determined. In other words, the etch depth may be calculated from the set of pre and post-processing measurements. Although the set of pre-processing measurement data points is not necessary in calculating the thickness of a substrate, a more accurate etch depth for each data points may be calculated by including both pre and post-processing measurements. As an alternative to obtaining pre-processing measurement data points, assumptions may be made regarding the pre-measurement thickness from the specification data furnished by the raw substrate manufacturer, for example.

Consider the situation wherein, for example, etch rates are being calculated to determine the substrate offset. An etch rate for each data point may be calculated by dividing the etch depth by the substrate process time, in an embodiment. In this document, various implementations may be discussed using etch rate. This invention, however, is not limited to etch rate and may be employed with etch depth.

In an embodiment, the pre and post-processing measurements may also include the radius for each data points (defined herein as the distance measured along the line that joins the data point location and the geometric center of the substrate). In an example, data point 1 is 148.2 millimeter from the center of the substrate. Since an etch rate has been calculated for each data point, the radius (R) value for each data point may now be associated with each etch rate. Furthermore, the orientation for each data point may also be determined. As the term is employed herein, the orientation refers to the angle offset from a reference radius line. Thus, a data point may be characterized by one or more of the following: its pre-processing etch depth, its post-processing etch depth, its calculated etch rate, its radial distance from the substrate's geometric center, and its orientation.

In an embodiment, an etch profile may he determined for each orientation (θ). As discussed herein, orientation (θ) refers to an angle from 0 degree to 360 degrees on a substrate from a fixed reference radial line. Examples of orientation include, but are not limited to, 0 degree, 45 degrees, 90 degrees, 180 degrees, 270 degrees, and the like.

Furthermore, one or more substantially concentric circles may be determined for each etch rate, in an embodiment. In an example, for an etch rate of 1000 angstroms per minute, a plurality of data points having an etch rate of 1000 angstroms per minute may be determined on the substrate. These data points form a substantially concentric circle around the processing center of the substrate. Note that if the substrate had been centered over the processing center of the chuck, i.e., if the substrate's geometric center had coincided with the chuck's processing center during processing, the concentric circles for the various etch rates tend to be centered around the geometric center of the substrate. However, since the substrate's processing center is unknown at this point, and the test substrate had been centered over the robot's geometric center the center for the concentric circles for the various etch rates would be offset from the geometric center of the substrates. Embodiments of the invention take advantage of this fact to calculate the offset between the chuck's process center and the robot's center.

In an embodiment, each substantially concentric circle on the substrate for a given etch rate may also be represented as a substantially sinusoidal curve graphically. In other words, for a given etch rate, the distance between the location on the radius line where that given etch rate is found aid the substrate's geometric center varies sinusoidally as one rotates through 360 degrees around the substrate's geometric center. Each point on the off-centered plot for a given position that matches the given etch rate represents a radial distance (E) from the substrate's geometric center for a specific orientation (θ).

In an embodiment, an off-centered plot may be created for each etch rate. The substrate offset may then be calculated by knowing at least one off-centered plot. From an off-centered plot, a curve-fitting equation (e.g.. Fourier Series Equation from Fourier Transform, Least Square Fit, etc.) may be employed to mathematically calculate the offset between the process center from the hardware (i.e., geometric) center. Once the substrate offset has been determined, the robotic arm of the vacuum transfer module may be programmed with the new coordinates for the process center of the substrate chuck for a processing chamber.

The features arid advantages of the invention may be better understood with reference to the figures and discussions that follow. FIG. 1 shows, in an embodiment, a block diagram of an overview of a typical substrate process system from which from which process center may be determined. A plasma processing system 100 may include a plurality of substrate-holding locations that enable a substrate to be processed as it moves from an atmospheric transfer module 102 to a vacuum transfer module 104 to one or more process modules (106, 108, 110, and 112) and ultimately back out of plasma processing system 100.

Consider the situation wherein, for example, a substrate is being processed. Prior to being processed, the thickness of a substrate 114 at various locations on the substrate may be measured. Substrate 114, which may include a refractive film layer, may be measured by a metrology tool 116. In measuring the thickness of substrate 114, a plurality of data points at various measurement locations may be collected. In an embodiment, two or more data points may be collected. In another embodiment, about 100-200 data points may be taken at different locations on substrate 114.

Once pre-processing measurements have been completed, substrate 114 may be placed on a front opening unified pod (FOUP) 118. A robotic arm 120 within atmospheric transfer module 102 may move substrate 114 to an aligner 122. At aligner 122, substrate 114 may be centered properly over the chuck's geometric center (as would be the case for the test substrate since the process center is not yet ascertained). Once centered, robotic arm 120 may move substrate 114 to one of the airlock modules (AL 124 and AL 126). The ability of the airlock modules to match the environment between atmospheric transfer module 102 and vacuum transfer module 104 allows substrate 114 to move between the two pressurized environments without being damaged.

From an airlock module, such as AL 124, substrate 114 may be moved into one of the process modules (106, 108, 110, and 112) by a robotic arm 128 within vacuum transfer module 104. Once substrate 114 has been processed (e.g., etching), robotic arm 128 may move substrate 114 from vacuum transfer module 104 through atmospheric transfer module 102 to FOUP 118.

From FOUP 118, substrate 114 may be moved to metrology tool 116 to be measured. In measuring the thickness of substrate 114 after processing, some or all of the same data point locations that have been measured prior to processing may be measured again after substrate processing. In an example, if 120 data points have been collected at 120 locations during the pre-processing measurements then the data for at least the same 120 locations may be collected again during the post-processing measurements.

Figure 2B:
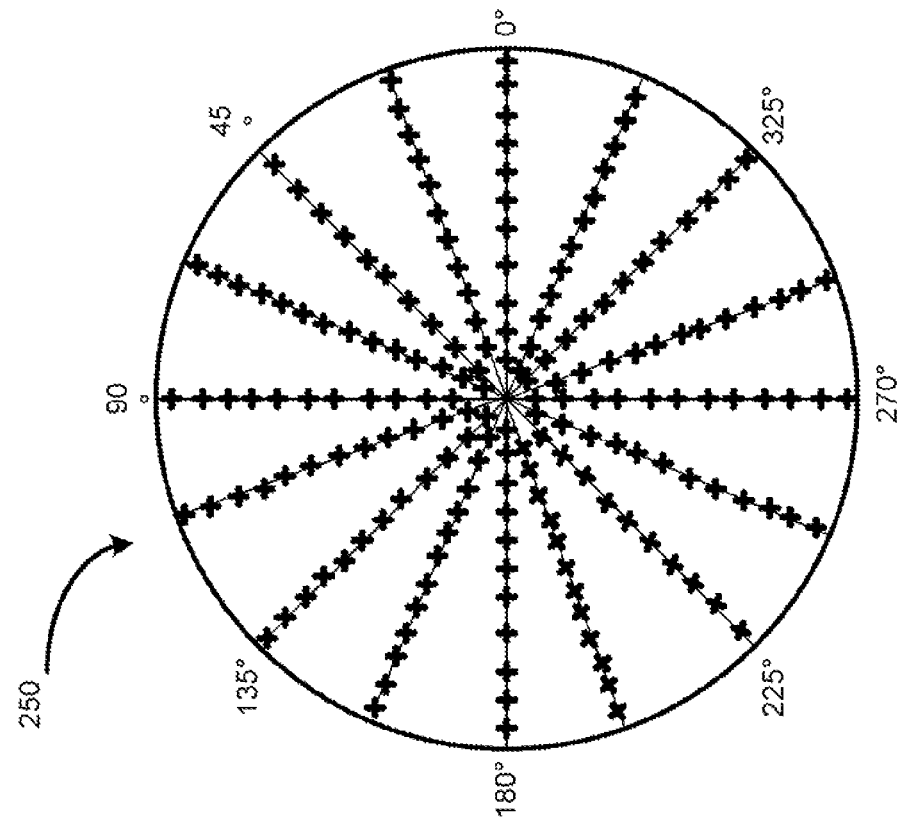
FIG. 2B shows, in an embodiment, a simple diagram illustrating the different data points that may be taken. Data points may be taken at various angles and distance from substrate center.
Figure 2A:
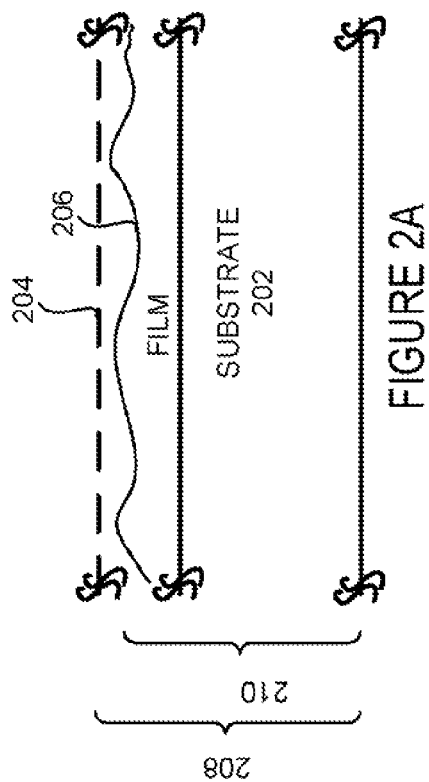
FIG. 2A shows, in an embodiment, a substrate before and after processing.

FIG. 2A shows, in an embodiment, a substrate before and after processing. Substrate 202 may have a film layer 204. Film layer 204 may be, for example, a refractive material that may allow a metrology tool to measure the thickness of the substrate. Prior to processing, the metrology tool may measure from the bottom of substrate 202 to film layer 204 (i.e., distance 208).

Unless there is a substantial defect in the raw substrate, the pre-processing measurements for each data points on substrate 202 tend to be fairly similar. In an example, the thickness of the substrate at data point 1 may be almost the same thickness of the substrate at data point 2, with the minor difference in thickness being attributable to the slight variability introduced during the manufacturing of the raw substrate. Prior to processing, the substrate tends to be substantially flat and the film layer tends to be distributed substantially even across the surface of the substrate.

In an embodiment, pre-processing measurements may be bypassed if the film layer thickness on the substrate is assumed to be evenly distributed. Due to potential thickness differences that may exist in a substrate before and after a film layer is added, pre-processing measurements may allow the technique to take into account for the differences in the thickness of the substrate at different locations on the substrate, in an embodiment.

After processing, part of film layer 204 may be etched from substrate 114. The film layer 204 is now shown as etched film layer 206. As a result of the processing, the thickness of the film layer now varies at different locations on the substrate. Reference number 210 represents the new thickness of substrate 202 at a given location on the substrate, for example. Post-processing measurements, which may be performed after substrate processing, may measure the new thickness of the substrate at various locations.

FIG. 2B shows, in an embodiment, a simple diagram illustrating the different data points that may be measured. A substrate view 250 shows a plurality of data points at different orientations (e.g., 0 degree, 45 degrees, 90 degrees, etc.). In both pre and post-processing measurements, thickness data for the same substrate locations may be collected. In an embodiment, the collection of data points may be performed manually. In another embodiment, a scan pattern may be identified and employed to perform pre and post-processing measurements.

In an embodiment, etch depth may be calculated from the pre and post-processing measurements. As discussed herein, the terra etch depth refers to the portion of the film layered substrate that has been etched. In other words, etch depth is the difference between the pre-processing measurement data and the post-processing measurement data for a given substrate location.

In an embodiment, the etch depth may be represented as an etch rate by dividing the process duration time of the substrate into the etch depth. In an example, a substrate location may have a pre-processing measurement of about 0.5 millimeters. Once the substrate has been processed, the thickness of the substrate at the same location is now 0.375 millimeters. Given that the etch depth is the difference between the pre and post-processing measurements, the etch depth at a given location (e.g., orientation of 0 degree, radius of 11.5 mm) is 0.125 millimeters. If the process time for substrate 114 is 2 minutes, then the etch rate is 0.0625 angstroms per minute for that location. Once the etch rate has been determined, each of the data points on the substrate may now be associated with an etch rate.

In an embodiment, besides measuring the thickness of a substrate, a metrology tool may also measure the radial distance from the substrate geometric center for each data point collected. FIG. 2C shows, in an embodiment, a radius measurement for each data point. In an example, a substrate view 260 shows data points 270 and 272. Associated with data point 270 is radius 278 and associated with data point 272 is radius 276. For each data point that may be collected, a radial distance from the substrate geometric center (which coincides with the hardware center for the test substrate centering geometrically on the chuck substrate) may be measured.

Figure 3:
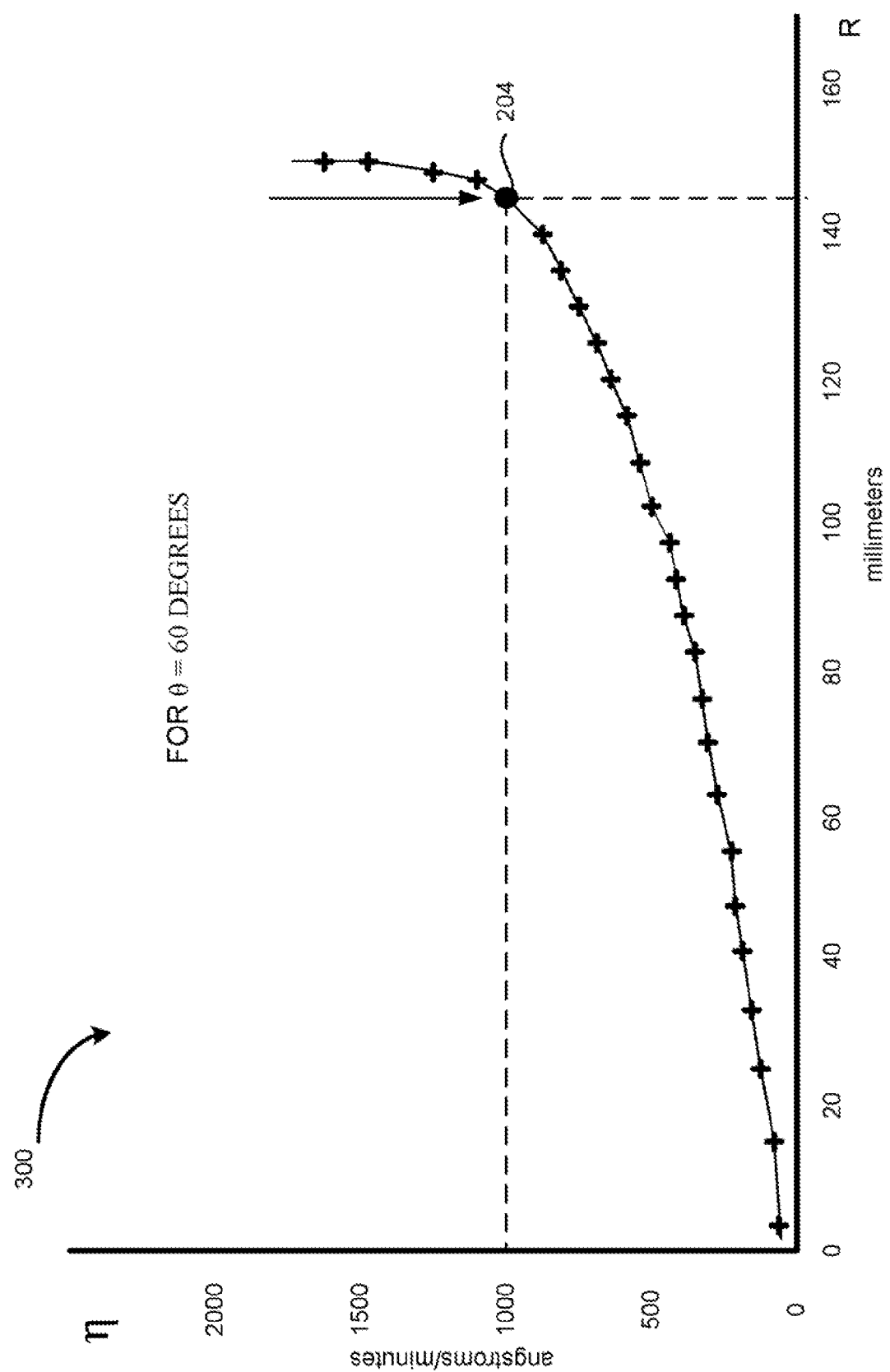
FIG. 3 shows, in an embodiment, a simple graph illustrating an etch profile for an orientation.

The location of a particular data point on the chuck may be specified by its radius and its orientation from a reference radius line. FIG. 3 shows, in an embodiment, a simple graph illustrating an etch profile for an orientation. As can be seen from FIGS. 2B and 2C, an orientation may have a plurality of etch rates that vary according to the distance from the substrate's geometric center. A graph view 300 shows a plurality of etch rates (η) plotted versus a plurality of radiuses (R) for orientation (θ) of 60 degrees. For each orientation (e.g., 0 degree, 45 degrees, 90 degrees, etc) an etch profile (e.g., etch rate profile, etc.) may be plotted, in an embodiment.

Once various etch profiles has been established for various orientation angles, a substantially concentric circle may be determined for each etch rate. In an embodiment, a linear interpolation or cubic spline may be performed to determine the radius for data points having a given etch rate. In an example, an etch rate of 1000 angstroms per minute at an orientation of 60 degrees may have a radius of 145 millimeter (as seen in FIG. 3). The same etch rate at a different orientation may have a different radius as seen in FIG. 3. For each orientation, a radius measurement may be determined for the same etch rate of 1000 angstrom per minute.

Figure 4:
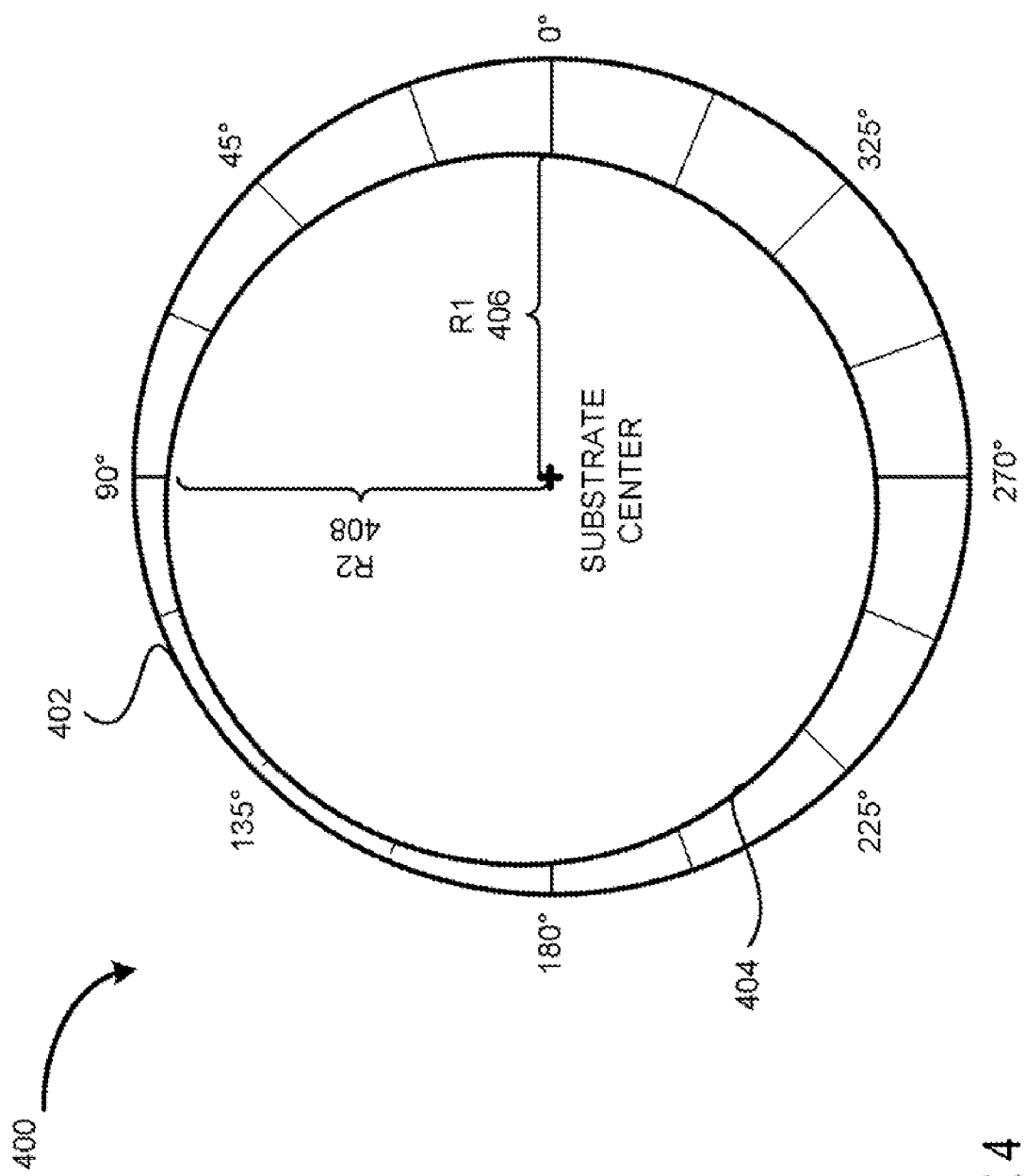
FIG. 4 shows, in an embodiment, a simple diagram of a substantially concentric circle for a constant etch rate.

FIG. 4 shows, in an embodiment, a simple diagram of a substantially concentric circle for a constant etch rate. A substrate view 400 shows a substrate 402 and a concentric circle 404. For each etch rate, a plurality of radiuses (e.g., R1 406 and R2 408), which may have been extrapolated from a plurality of etch profiles (as seen in FIG. 3) may be employed to create a substantially concentric circle 404, in an embodiment.

Figure 5:
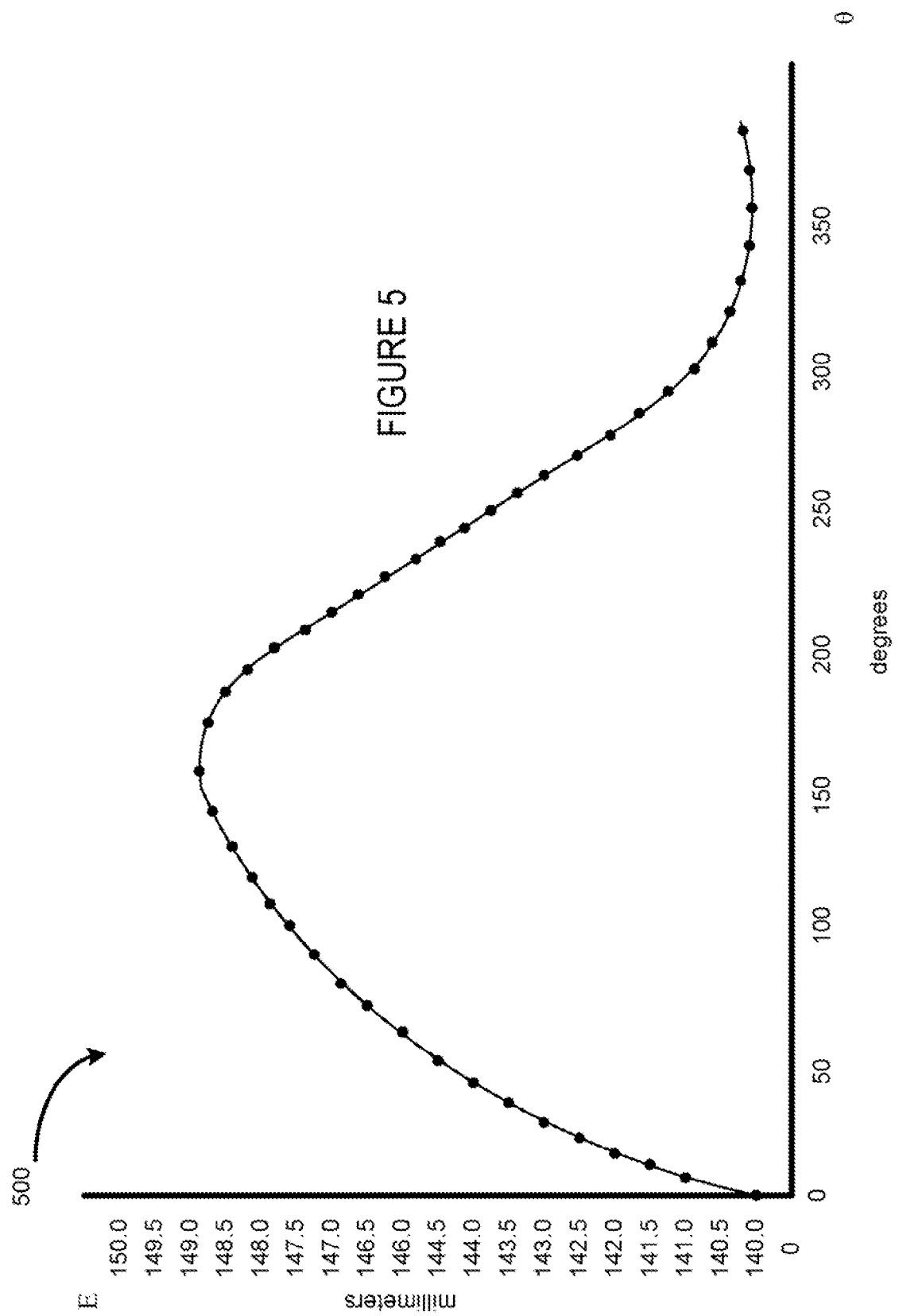
FIG. 5 shows, in an embodiment, a graph showing the radial location versus azimuthal direction of a sufficiently off-centered constant etch rate circle.

FIG. 5 shows, in an embodiment, a graph showing the radial location versus azimuthal direction of a sufficiently off-centered constant etch rate circle. Graph view 500 shows a plurality of radiuses (E), representing the distance between the substrate location having such etch rate and the substrate's geometric center, plotted versus a plurality of orientations (θ) for a constant etch rate (e.g., 1000 angstroms per minute). Note that if the substrate's geometric center had coincided with the substrate's process center, the off-centered plot (e.g., that shown in FIG. 5) would have been substantially flat.

For each etch rate, an off-centered plot similar to FIG. 5 may be plotted. The off-centered plot, in an embodiment, may have a substantially sinusoidal shape. In an embodiment, a process center may be calculated from at least one off-centered plot.

Once an off-centered plot has been plotted, a curve-fitting equation (e.g., Fourier Series Equation from Fourier Transform, Least Square Fit, etc.) may be employed to determine the parameters for Equation 1.

$$E_n(\theta,\gamma,R)=E_{avg}+\Delta c\cos(\theta-\phi_1)+\Delta c_2\cos(2\theta-\phi_2) \quad \text{[EQUATION 1]}$$

| Parameter | Description |
| --- | --- |
| $E_{avg}$ | average distance from a substrate center for a constant etch rate |
| $\Delta c\cos(\theta-\phi_1)$ | first harmonics - deviation as a function of an orientation |
| $\Delta c_2\cos(2\theta-\phi_2)$ | second harmonics |
| $\Delta c$ | distance measurement between 2 centers |
| R | radius |
| θ | orientation |
| φ | angle of which the offset is in |

Figure 6:
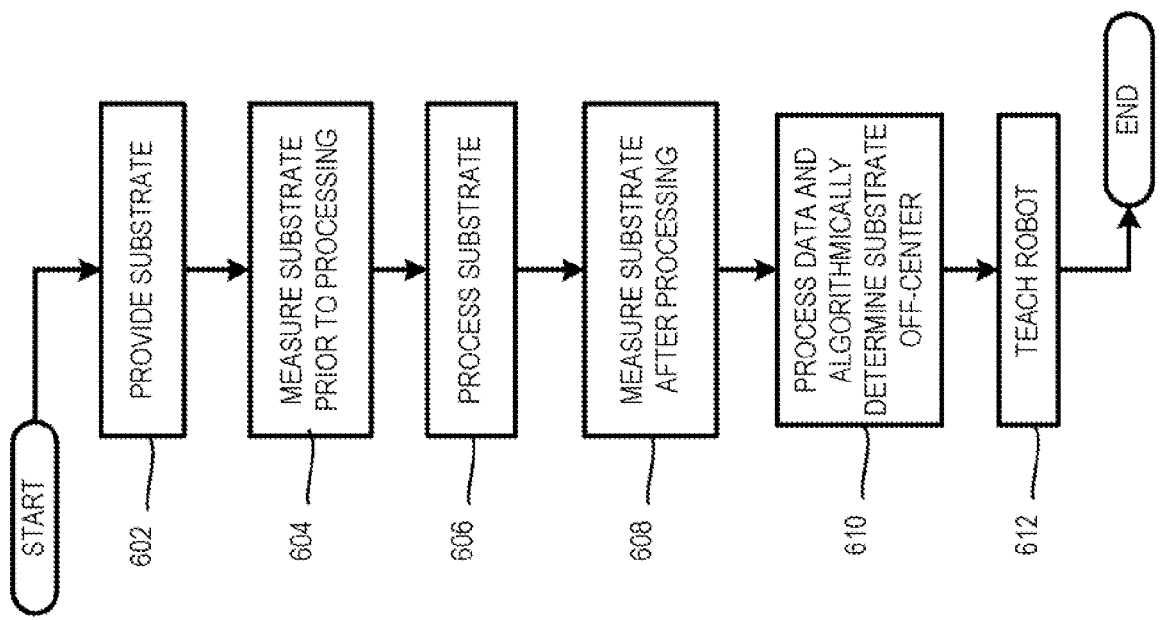
FIG. 6 shows, in an embodiment, a simple flow chart illustrating the steps for calculating a process center for a substrate chuck.

FIG. 6 shows, in an embodiment, a simple flow chart illustrating the steps for calculating a process center for a substrate chuck.

At a first step 602, a substrate is provided. In an embodiment, the substrate may have a film layer (e.g., refractive film layer).

At a next step 604, the substrate may be measured prior to processing. In an embodiment the thickness of the substrate with film layer may be measured at a plurality of data points. Instead of manually measuring the data points, a scan pattern may be employed to collect the data points.

At a next step 606, the substrate may be processed in a plasma processing chamber while the substrate is geometrically centered over the chuck's geometric center. In an embodiment, the substrate may not have to be entirely processed. In an example, the substrate may only have to be processed for a duration that is sufficient to remove a portion of the film layer.

Once the substrate has been removed from the plasma processing chamber, at a next step 608, the substrate may be measured. In an embodiment, the same scan pattern that may have been employed in collecting the pre-processing measurements may be utilized to collect the post-processing measurements.

Figure 7:
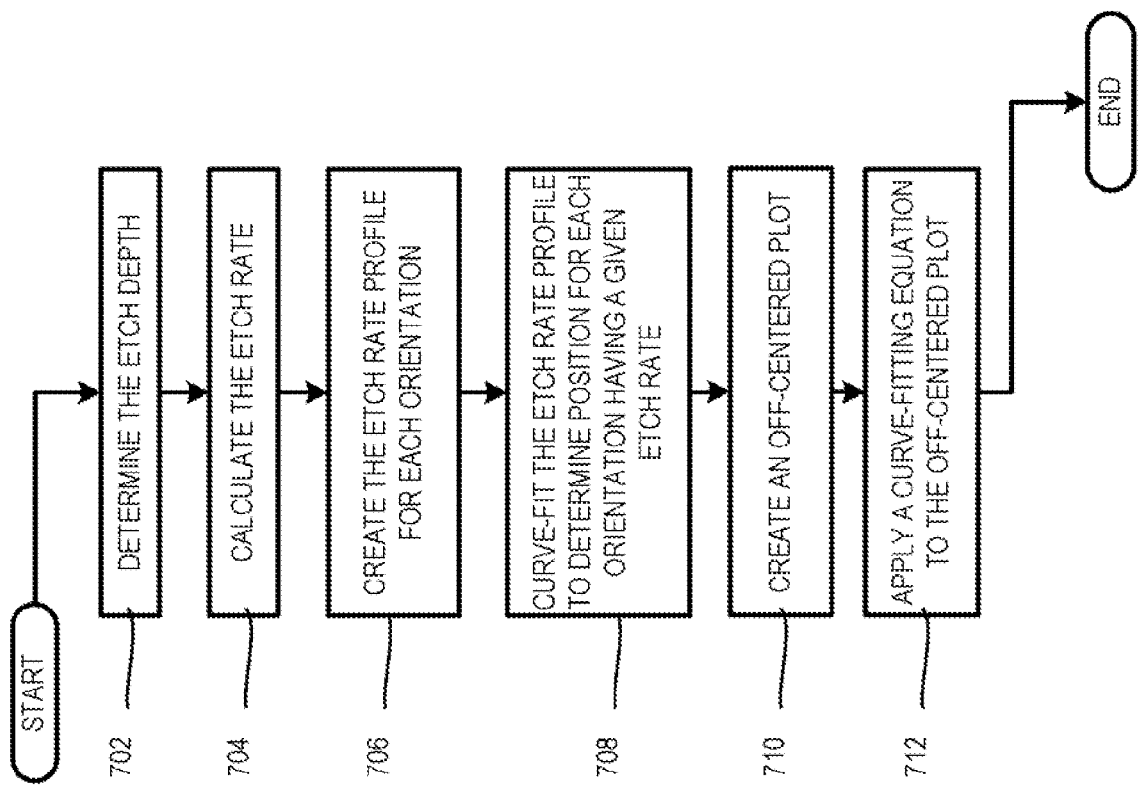
FIG. 7 shows, in an embodiment, the algorithm for determining the process center.

At a next step 610, the data points may be processed and the process center may be algorithmically determined. FIG. 7 shows, in an embodiment, an algorithm for determining the process center.

At a first step 702, the etch depth for each data point may be calculated. To calculate the etch depth, the pre-processing measurement of the measurement location for a data point may be subtracted from the post-processing measurement.

At a next step 704, the etch rate for each data location may be calculated. To calculate the etch rate, the etch depth of a data point may be divided by a substrate process time.

At a next step 706, an etch profile (e.g., etch rate profile, etc.) may be created for each orientation. In an example, the etch rate for each data point at a specific orientation may be plotted to create an etch profile.

At a next step 708, by curve-fitting the etch profile, a position (E) may be determined for each orientation having a given etch rate.

An off-centered curve may be plotted for each etch rate, at a next step 710. In an example, the radius for an etch rate at a specific orientation may be extrapolated from the etch profile. Once a radius at a constant etch rate has been extrapolated for each etch profile, a substantially sinusoidal off-centered plot may be generated.

At a next step 712, a curve-fitting equation (e.g., Fourier Series Equation from Fourier Transform, Least Square Fit etc.) may be employed to determine the parameters for the substrate offset. Note that if the substrate's geometric center had coincided with the chuck's process center, the off-centered plot (e.g., that shown in FIG. 5) would have been substantially flat. Curve fitting as a mathematical approach and various techniques therefore are known to those skilled in the art.

Referring back to FIG. 6, once the parameters have been determined, at a final step 612, the parameters may be taught to the robotic arm in the transfer module (e.g., atmospheric transfer module, vacuum transfer module, etc.). As a result, the robotic arm may now have the correct coordinates to offset a subsequent substrate on a substrate chuck such that the substrate may be centered over the chuck's process center during processing.

It should be appreciated that although Equation 1 and the figures herein follow a particular example implementation of the invention, the invention may be practiced in various equivalent ways in accordance with the circular constant etch rate method. As long as process result measurements can be obtained from a geometrically-centered test substrate to facilitate the creation of one or more constant etch rate concentric circles, various mathematical techniques may be applied to determine the offset between the center of the concentric circle(s) and the geometric center of the chuck (which coincides with the geometric center of the substrate for a test substrate that is geometrically centered over the chuck during processing). Once the offset is determined, the offset information may be provided to the tool to allow subsequent substrates to be centered over the chuck's process center (as opposed to the chuck's geometric center).

As can he appreciated from the foregoing, the methods described above may be applied not only toward different etching tools (e.g., a bevel etcher took a VERSYS etch system, and the like) but may also be applied to any other systems and/or tools (e.g., deposition tools, cleaning systems, and the like) that may also benefit from being able to identify non-uniform profile.

In an embodiment of the invention, a circular constant deposition rate method for calculating the process center for a substrate chuck within a deposition chamber is provided by extrapolating data from a set of measurements made on a substrate that has been geometrically centered over the chuck's hardware center during processing. Similar to the circular constant etch rate method, the substrate offset may be inferred for the deposition tool from the deposition rate measurements made on a test substrate that has been geometrically centered over the chuck during processing. Similar with the circular constant etch rate method, for a clean tool, the particle density may be used to infer the substrate offset. With the calculated substrate offset, a robotic arm within a transfer module of a deposition tool may be programmed with the coordinates of the chuck's process center to facilitate centering of subsequent substrates over the chuck's process center to improve uniformity.

In an embodiment, the circular constant deposition rate method may include collecting a set of pre-processing measurement data and a set of post-processing measurement data at the same data points on a substrate. By calculating the difference between the pre and post-processing measurements for each data point, the amount of a film layer that has been added may be determined. The circular constant deposition rate method is similar to the circular constant etch rate method; however, instead of performing the calculation by subtracting the post-processing measurement data from the pre-processing measurement data, the amount of film layer that has been added may be determined by subtracting the pre-processing measurement data from the post-processing measurement data.

Figure 20:
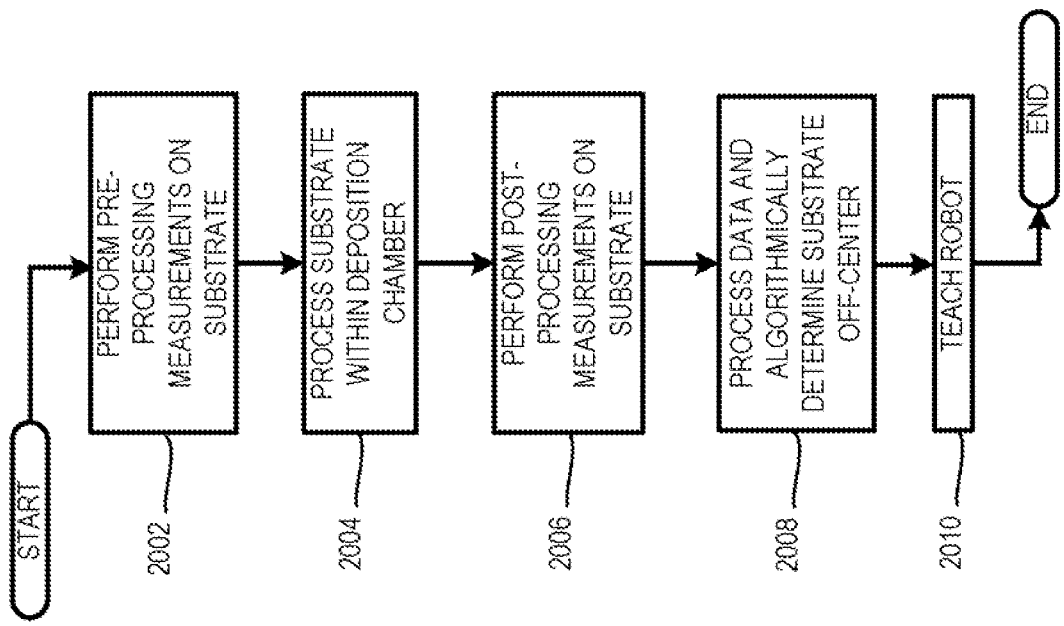
FIG. 20 shows, in an embodiment, a simple flow chart illustrating the steps for calculating a process center for a substrate chuck within a deposition chamber.
Figure 21:
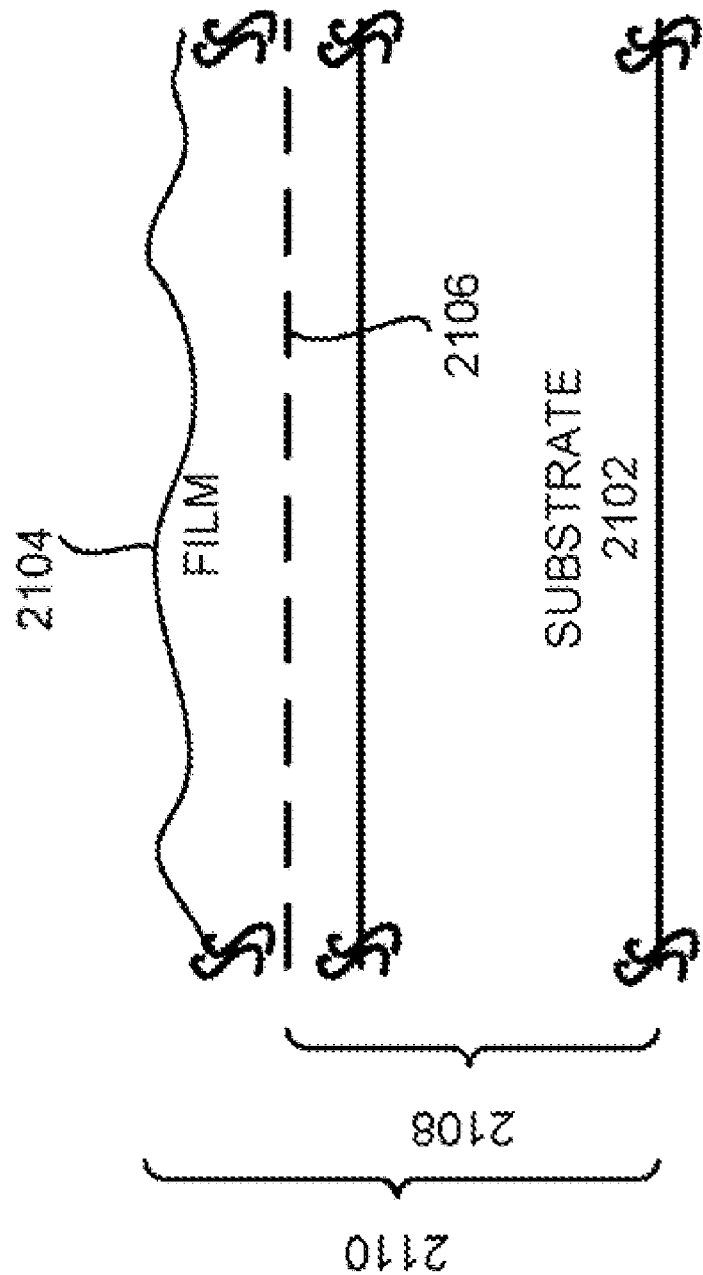
FIG. 21 shows, in an embodiment, a substrate before aid after processing.

To facilitate discussion, FIG. 20 shows, in an embodiment, a simple flow chart illustrating the steps for calculating a process center for a substrate chuck within a deposition chamber. Consider the situation wherein, for example, a substrate 2102 (as shown in FIG. 21) is processed.

Before being processed, pre-processing measurement may be collected for substrate 2102, at a first step 2002. Prior to processing, the metrology tool may measure from the bottom of a substrate 2102 to layer 2106 (i.e., distance 2108). In an embodiment, the thickness of the substrate may be measured at a plurality of data points. The data points may be gathered manually or may be collected by employing a scan pattern.

Generally, the pre-processing measurements for each data points on a substrate 2102 tend to be fairly similar. In an example, the thickness of the substrate at data point 1 and data point 2 may be quite similar with a possible minor difference in thickness being attributable to the slight variability introduced during the manufacturing of the raw substrate. Thus, prior to processing, the substrate tends to be substantially flat.

In an embodiment, besides measuring the thickness of a substrate, a metrology tool may also measure the radial distance from the substrate geometric center (which coincides with the hardware center for the test substrate centering geometrically on the chuck substrate) for each data point collected. The location of a particular data point on the chuck may be specified by its radius and its orientation from a reference radius line. Usually, an orientation may have a plurality of deposition rates that vary according to the distance from the substrate's geometric center. For each orientation (e.g., 0 degree, 45 degrees, 90 degrees, etc.) a thickness profile may be plotted, in an embodiment.

At a next step 2004, the substrate may be processed in a deposition chamber. In an embodiment, the substrate may not have to be entirely processed. Instead, the substrate may be processed up to the point in which sufficient materials, such as PECVD oxide, for example, have been added.

At a next step 2006, the substrate may be removed from the deposition chamber for post-processing measurements. In an embodiment, the same scan pattern that may have been employed in collecting the pre-processing measurements may be utilized to collect the post-processing measurements. In an example, after processing, a deposition layer 2104 may be added to substrate 2102. In an example, an oxide, such as plasma-enhanced chemical vapor deposition (PECVD), for example, may have been deposited onto substrate 2102. As a result of the processing, the thickness profile of substrate 2102 may now be non-uniform. Reference number 2110 represents the new thickness of substrate 2102 at a given location on the substrate, for example. Post-processing measurements, which may be performed after substrate processing, may measure the new thickness of the substrate at various locations.

At a next step 2008, the data points may be processed and the process center may be algorithmically determined.

Figure 22:
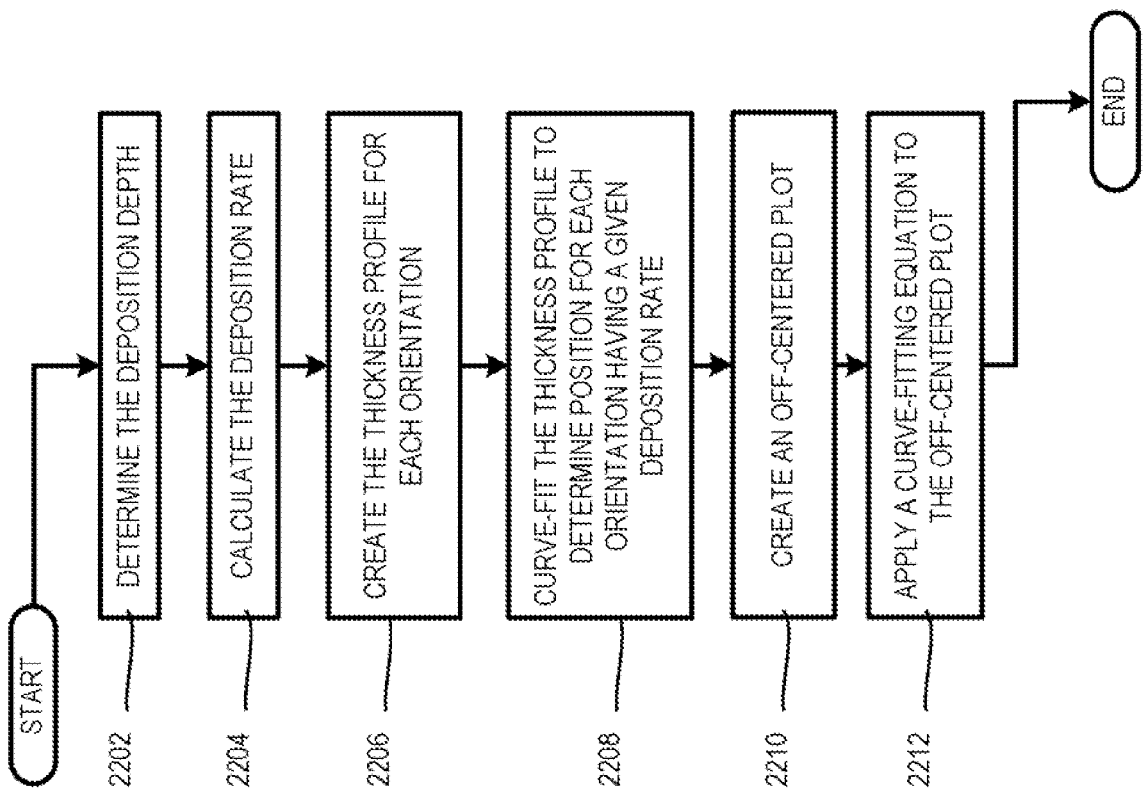
FIG. 22 shows, in an embodiment, an algorithm for determining the process center.

FIG. 22 shows, in an embodiment, an algorithm for determining the process center.

At a first step 2202, the deposition depth for each data point may be calculated. In both pre and post-processing measurements, thickness data for the same substrate locations may be collected. In an embodiment, deposition depth may be calculated from the pre and post-processing measurements. As discussed herein, the term deposition depth refers to the portion of the film layered substrate that has been added to the substrate. In other words, deposition depth is the difference between the post-processing measurement data and the pre-processing measurement data, for a given substrate location.

At a next step 2204, the process rate (e.g., deposition rate) for each data location may be calculated. In an embodiment, the deposition depth may be represented as a deposition rate by dividing the process duration time of the substrate into the deposition depth. In an example, a substrate location, may have a pre-processing measurement of about 0.55 millimeters. Once deposition has occurred, the thickness of the substrate at the same location is now 0.72 millimeters. Given that the deposition depth is the difference between the pre and post-processing measurements, the deposition depth at a given location (e.g., orientation of 0 degree, radius of 115 mm) is 0.17 millimeters. If the process time for the substrate is 2 minutes, then the deposition rate is 0.085 angstroms per minute for that location. Once the deposition rate has been determined, each of the data points on the substrate may now be associated with a deposition, rate.

At a next step 2206, a thickness profile may be created for each orientation. In an example, the deposition rate for each data point at a specific orientation may be plotted to create a thickness profile. Once various thickness profiles have been established for various orientation angles, a substantially concentric circle may be determined for each deposition rate. In an embodiment, a linear interpolation may be performed to determine the radius for data points having a given deposition rate. In an example, a deposition rate of 1000 angstroms per minute at an orientation of 60 degrees may have a radius of 145 millimeter. The same deposition rate at a different orientation may have a different radius. Thus, for each orientation, a radius measurement may be determined for the same deposition rate of 1000 angstrom per minute.

At a next step 2208, by curve-fitting the thickness profile, a position (E) may be determined for each orientation having a given deposition rate.

An off-centered curve may be plotted for each deposition rate, at a next step 2210. In an example, the radius for a deposition rate at a specific orientation may be extrapolated from the thickness profile. Once a radius at a constant deposition rate has been extrapolated for each thickness profile, a substantially sinusoidal off-centered plot may be generated.

At a next step 2212, a curve-fitting equation (e.g., Fourier Series Equation from Fourier Transform, Least Square Fit. etc.) may be employed to determine the parameters for the substrate offset. In other words, once an off-centered plot has been plotted, a curve-fitting equation (e.g., Fourier Series Equation from Fourier Transform, Least Square Fit etc.) may be employed to determine the parameters for the aforementioned Equation 1. Note, that the $E_{avg}$ is now referring to the average distance from a substrate center for a constant deposition rate (instead of constant etch rate).

Referring back to FIG. 20, once the parameters have been determined, at a final step 2010, the parameters may be taught to the robotic arm in the transfer module (e.g., atmospheric transfer module, vacuum transfer module, etc.). As a result, the robotic arm may now have the correct coordinates to offset a subsequent substrate on a substrate chuck such that the substrate may be centered over the chuck's process center during processing. In an embodiment, in ongoing production environment, the wafer positioning based off the coordinates fed to the robotic arm may be a parameter that may be monitored for statistical process control.

Figure 23:
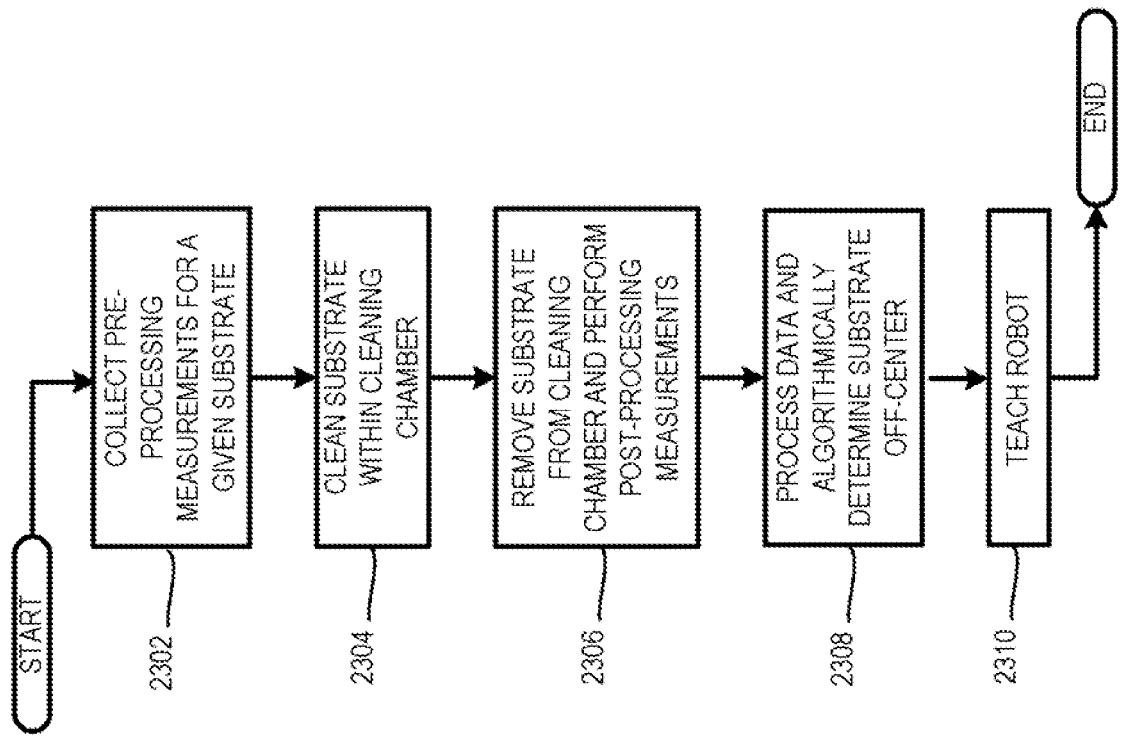
FIG. 23 shows, in an embodiment, a simple flow chart illustrating the steps for calculating a process center for a substrate chuck within a cleaning chamber.

As aforementioned, the above methods may also be applied to correct the offset in a cleaning system. In an embodiment of the invention, a circular defect density method for determining the process center for a substrate chuck within a cleaning chamber is provided. To facilitate discussion. FIG. 23 shows, in an embodiment, a simple flow chart illustrating the steps for calculating a process center for a substrate chuck within a cleaning chamber.

At a first step 2302, pre-processing measurement data may be collected on a substrate. As aforementioned, the thickness of the substrate may be measured at a plurality of data, points. In addition, the radial distance from the substrate geometric center for each data point collected may also be measured.

At a next step 2304, the processed substrate may be cleaned in a cleaning chamber. As aforementioned, the substrate may not have to be entirely cleaned. Instead, the substrate may be processed up to the point in which sufficient materials have been removed from the substrate.

At a next step 2306, the substrate may be removed from the cleaning chamber for post-processing measurements. Usually, after cleaning, at least some of the materials deposited on the substrate may be removed. However, the removal process may not have removed the materials in a uniform manner. In an example, the cleaning chamber has drifted; therefore, the amount of materials removed across the substrate may not have been uniformed. To determine the non-uniformity, post-processing measurements may be taken at the same data points as that collected during step 2302.

At a next step 2308, the data points may be processed and the process center may be algorithmically determined. To algorithmically determine the process center, the density for each data point may be calculated, in an embodiment. As discussed herein, the term density depth refers to the portion of the materials that have been removed from the substrate, or the density of particle that remain on the substrate. The density depth may be calculated by subtracting a post-processing measurement from a pre-processing measurement for a given substrate location.

After the density depth has been determined, a process rate (e.g., density rate, cleaning rate) for each data point may be calculated by dividing the density depth by the process time, in an embodiment. In another embodiment, the pre and post-processing measurements may also include the radius for each data points. Since a density rate has been calculated for each data point, the radius (R) value for each data point may now be associated with each density rate. Furthermore, the orientation for each data point may also be determined. Thus, a data point may be characterized by at least one of the following; its pre-processing density depth, its post-processing density depth, its calculated density rate, its radial distance from the substrate's geometric center, and its orientation.

In an embodiment, the density rate for each data point at a specific orientation may be plotted to create a thickness profile. Once various density profiles have been established for various orientation angles, a substantially concentric circle and/or a substantially sinusoidal curve may be determined for each density rate. In other words, for a given density rate, the distance between the radius line where a given density rate is found and the substrate's geometric center may vary sinusoidally as one rotates 360 degrees around the substrate's geometric center. Thus, each point on the off-centered plot for a given position that matches the given density rate may represent a radial distance (E) from the substrate's geometric center for a specific orientation (θ). In an embodiment, a position (E) may be determined for each orientation having a given density rate by curve-fitting (e.g., linear interpolation, cubic spline, etc) the density profile. The off-centered curve may be plotted for each density rate by extrapolating from the density profile.

In an embodiment, the substrate offset may then be calculated by knowing at least one off-centered plot. From an off-centered plot, a curve-fitting equation (e.g., Fourier Series Equation from Fourier Transform, Least Square Fit, etc.) may be employed to mathematically calculate the offset between the process center from the hardware (i.e., geometric) center. Note, that the $E_{avg}$ is now referring to the average distance from a substrate center for a constant density rate (instead of constant etch rate).

At a next step 2310, once the parameters have been determined, the parameters may be taught to a robotic arm in plasma processing system. With the calculated substrate offset, the robotic arm may be programmed with the coordinates of the chuck's process center to center subsequent substrates over the chuck's process center during processing to improve uniformity. In addition, the wafer positioning may be a parameter that may be monitored for statistical process control.

As can be appreciated from the embodiments of the invention, the methods described (e.g., circular constant etch rate method, circular constant deposition rate method, circular defect density method, and the like) provide algorithms for determining a process center for a substrate chuck of a processing chamber. By identifying the process center of a substrate chuck, the methods essentially correct the misalignment that may occur, thus reducing the percentage of non-conformity that may happen during substrate processing. Further, by employing current metrology tools to collect pre and post-processing measurements, the methods do not require additional expensive purchases to accomplish since metrology tools are commonly available in most fabrication. In addition, the methods allow for a more accurate characterisation of chamber performance during processing by removing the substrate differences from the equation.

Another issue facing users in the prior art is fault detection. A plurality of semiconductor devices may be created from one substrate. To assure the quality of the devices, the substrate may be measured periodically throughout processing.

Generally, fault detection is an integral part of substrate processing. As discussed herein, fault detection refers to the process of identifying defects in a substrate and/or a substrate process. Example of fault detections may include, but are not limited to, identifying misalignment, identifying defects on the substrate, identifying defects in substrate processing, and identifying film clearance.

Figure 8:
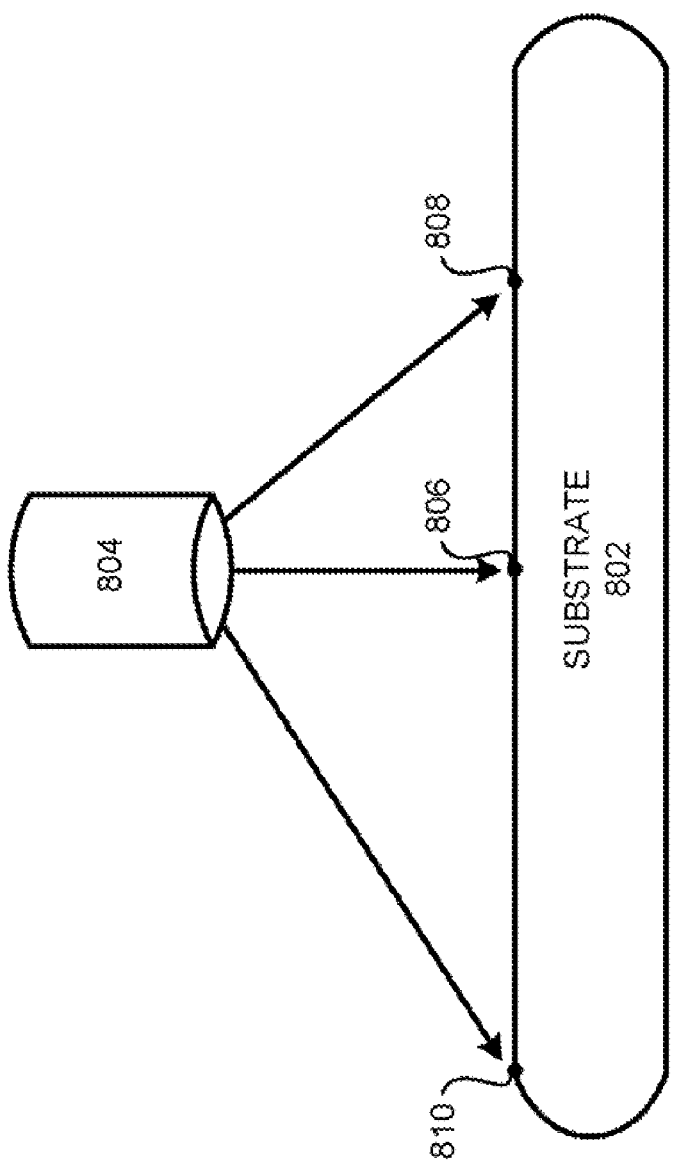
FIG. 8 shows a block diagram of a substrate being measured by an optical metrology tool.

There are various methods for performing fault detections in the prior art. In an example, optical metrology tool may be employed to produce images of the substrate which may allow defects on the substrate to be identified. FIG. 8 shows a block diagram of a substrate being measured by a prior art optical metrology tool. Consider the situation wherein, for example, a substrate 802 has been processed. To perform fault detection, an optical metrology tool 804 may be employed. In capturing images, optical metrology tool 804 may be dependent upon light to be reflected from a surface to capture a satisfactory image of substrate 802.

In an example, at points 806 and 808, optical metrology tool 804 may be able to take satisfactory images of the substrate because light tends not to bounce in multiple directions when light is being reflected from a flat surface. However, since light bounces off a non-flat (e.g., curved, or angled) surface in multiple directions, optical metrology tool 804 may have more difficulty capturing the images of the substrate along the substrate edge (point 810).

To capture images of a substrate edge, electron microscopy may be employed. However, electron microscopy is an expensive technique for capturing images of a substrate, requiring an expensive tool and a high level of technical expertise to accomplish.

First, an electron microscopy requires the substrate to be viewed in vacuum since the electron microscopy tends to be a sensitive instrument that may be affected by other electrons. In addition, due to the sample size limitation, electron microscopy usually requires the substrate to be broken down into smaller pieces. As a result, the electron microscopy is not usually used as an inline metrology tool during substrate processing. Although an electron microscopy may be large enough to accommodate the entire substrate, the cost of ownership can be extremely expensive. In addition, electron microscopy generally requires special preparation that may impact the composition of a substrate.

In the prior art, substrate processing has generally been performed away from the edges of a substrate. Thus, the inability of optical metrology tools to capture satisfactory images along the edges of the substrate has not posed a problem. However, precious real estate on the substrate has been sacrificed due to the inability to control the processing along the edges of the substrate, in recent years, new tools are focusing on processing along the edges of the substrate, flow ever, prior art metrology tools and methods are not sufficient to provide the types of images that may enable fault detections to be performed for this type of tools.

In accordance with embodiments of the present invention, there is provided a bevel inspection module (BIM) for capturing clear and sharp images at a substrate edge. In embodiments of the invention, a BIM may include hardware which may create an environment which is more conducive to the capture of satisfactory images of bevel edges of substrates. Embodiments of the invention also include manipulating the images to perform fault detections for processing area encompassing substrate edges.

Consider the situation wherein, for example, a substrate is being processed along or close to the edges. By processing along the edges of the substrate, the real estate of a substrate may be maximized. However, maximization may only occur if processing is achieved with substantially no defect. In the prior art, the area around the edges of a substrate has generally been sacrificed because fault detections have been difficult to implement.

Embodiments of the invention provide a bevel inspection module (BIM) to capture images (e.g., along the edges of a substrate) that have been difficult to capture in the prior art. In one aspect of the invention, the inventors herein realized that to create such an environment, the various components of the BIM need to have the flexibility to capture images at different views and angles. In an embodiment, hardware such as camera, optics enclosure, camera mount, and the like, have been implemented with adjustable positioning capability, thus providing flexibility m the positioning of the hardware. In another example, the inventors herein realized that insufficient lighting has prevented the ability to capture clear and sharp images. In an embodiment, the BIM provides additional lighting (e.g., backlighting), thus providing contrast between the background aid the substrate.

The BIM is, in an embodiment, a stand-alone tool that may be attached to a plasma processing system. By attaching the BIM to the plasma processing system, the BIM may be employed as an inline metrology tool during substrate processing.

Figure 9:
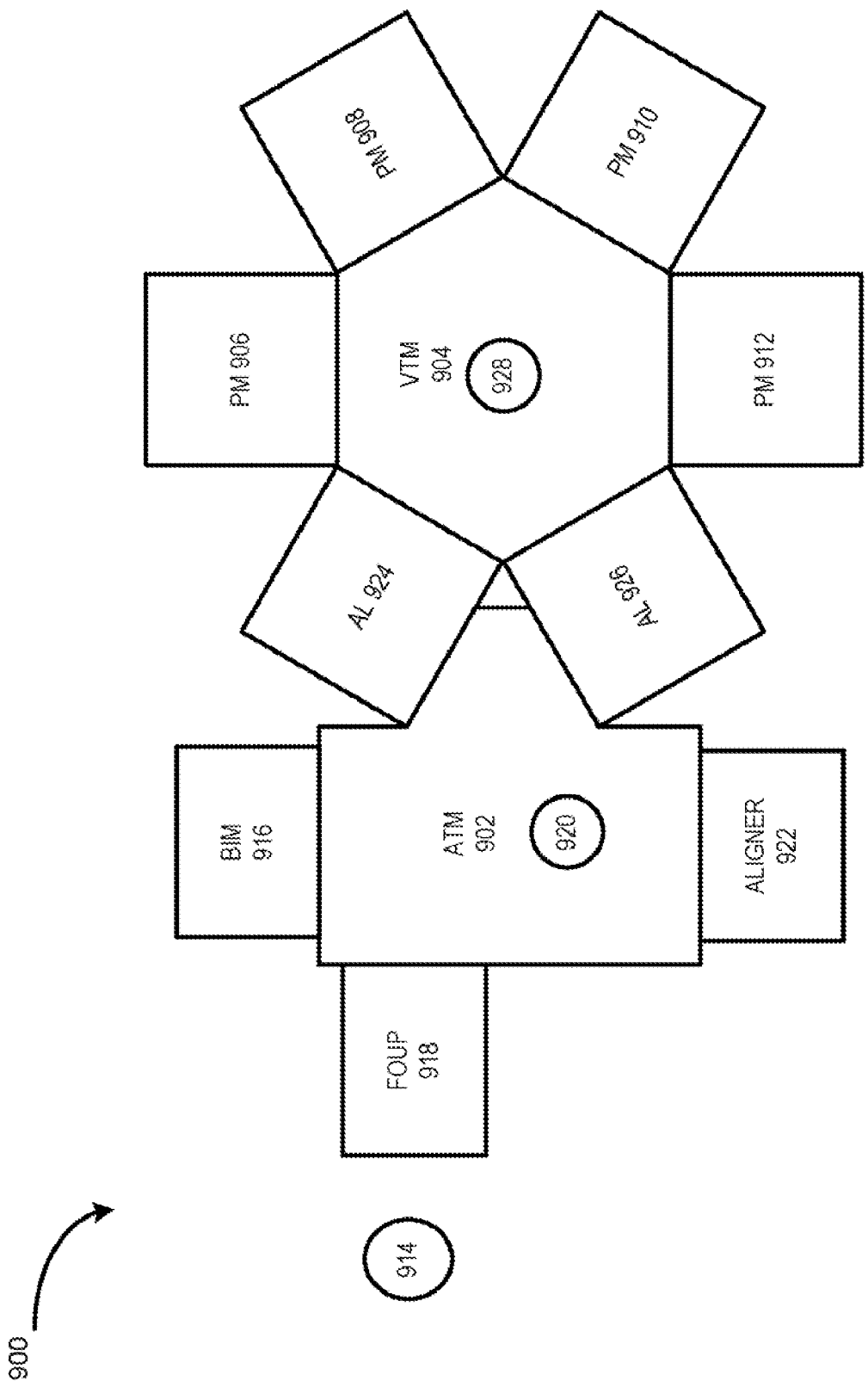
FIG. 9 shows, in an embodiment, a block diagram of an overview of a plasma processing system with a bevel inspection module (BIM).

The features and advantages of the invention may be better understood with reference to the figures and discussions that follow. FIG. 9 shows, in an embodiment, a block diagram of an overview of a plasma processing system with a bevel inspection module (BIM). In this document various implementations may be discussed using a plasma processing system. This invention, however, is not limited to a plasma processing system and may be employed with any processing system that may want to view bevel edges.

A plasma processing system 900 may include a plurality of substrate-holding locations that enable a substrate to be processed as it moves from an atmospheric transfer module 902 to a vacuum transfer module 904 to one or more process modules (906, 908, 910, and 912) and ultimately back out of plasma processing system 900.

Substrate 914 may be placed on a front opening unified pod (FOUP) 918. A robotic arm 920 within atmospheric transfer module 902 may move substrate 914 to an aligner 922. At aligner 922, substrate 914 may be centered properly. Once centered, robotic arm 920 may move substrate 914 to a BIM 916. In an embodiment, BIM 916 may include an aligner. If the aligner is included as part of the BIM then aligner 922 may be unnecessary.

In BIM 916, pre-processing images may be taken of substrate 914. Once BIM 916 has completed taken the pre-processing images, robotic arm 920 may move substrate 914 to one of the airlock modules (AL 924 and AL 926). The ability of the airlock modules to match the environment between atmospheric transfer module 902 and vacuum transfer module 904 allows substrate 914 to move between the two pressurized environments without being damaged.

From an airlock module, such as AL 924, substrate 914 may be moved into one of the process modules (906, 908, 910, and 912) by a robotic arm 928 within vacuum transfer module 904. During processing, substrate 914 may be analyzed periodically. In an example, after processing has been completed in process module 906, robotic arm 928 may transfer substrate 914 from process module 906 through vacuum transfer module 904 through AL 924 to robotic arm 920. Robotic arm 920 may move substrate 914 to BIM 916 for performing inline inspection. Once inspection has been completed, substrate 914 may be moved back into one of the processing modules to continue processing. Since BIM 916 may be connected to plasma processing system, inline metrology may be performed periodically throughout the processing to enable an operator to perform analysis on substrate 914.

In an embodiment, BIM 916 may be disconnected from plasma processing system 900. Although BIM 916 may still be able to provide the same support, as though it was connected, additional steps may have to be performed. By having BIM 916 connected to plasma processing system 100, inline metrology may be performed without manual interference.

Figure 10:
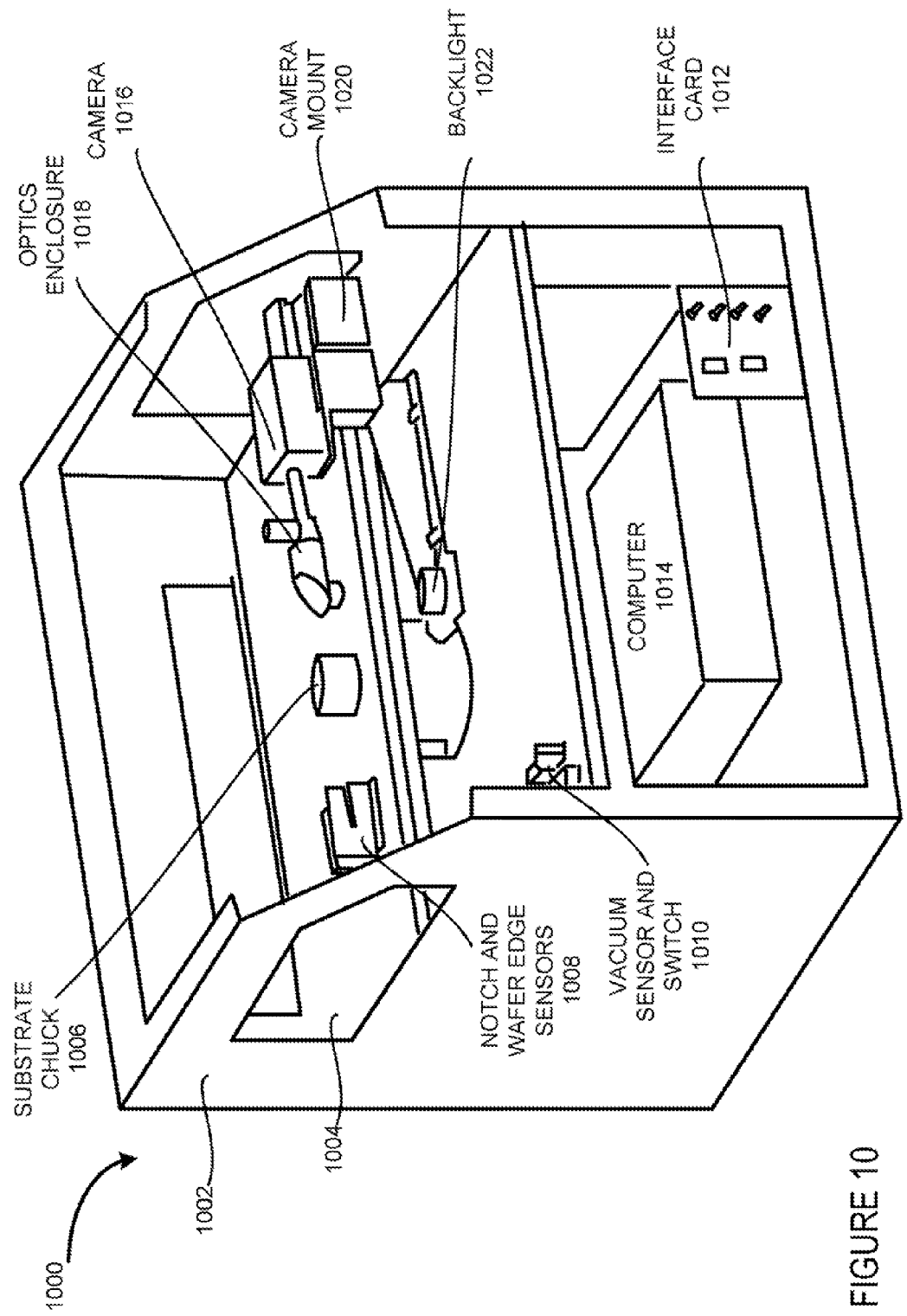
FIG. 10 shows, in an embodiment, a system diagram of a BIM.

FIG. 10 shows, in an embodiment, a system diagram of a BIM. A BIM 1000 may have an enclosure 1002, which may enable BIM 1000 to he mounted directly to an atmospheric transfer module. By being directly connected to the atmospheric transfer module, BIM 1000 may enable inline metrology to occur during substrate processing, in an embodiment.

BIM 1000 may have a fly opening 1004, from which substrate may be placed onto a substrate chuck 1006. BIM 1000 may also include notch and wafer edge sensors 1008, which may be capable of identifying the substrate and the substrate notch. Notch and wafer edge sensors 1008 may behave similar to aligner 922 of FIG. 9. If notch and wafer edge sensors 1008 is included in BIM 1000, then an aligner may be an optional module.

BIM 1000 may also include a vacuum sensor and switch 1010, which may identify when a substrate is disposed on top of substrate chuck 1006. In an example, when vacuum sensor and switch 1010 is in an "on" position, then the substrate is firmly attached to substrate chuck 1006 and a robotic arm is prevented from removing the substrate. When vacuum sensor and switch 1010 is in an "off" position, the robotic arm is able to remove the substrate from BIM 1000.

BIM 1000 may also include an interface card 1012, which is an input/output hoard. Interface card 1012 may act as a controller of the electronics that may be utilized by BIM 1000. BIM 1000 may also include a computer 1014, which may be connected to interface card 1012.

BIM 1000 may also include a camera 1016 and an optics enclosure 1018, which enable images to be taken. Optics enclosure 1018 may be extended from camera 1016. Camera 1016 and optics enclosure 1018 are mounted on a camera mount 1020. BIM 1000 may also include a backlight 1022, which provides lighting to the background.

Figure 11:
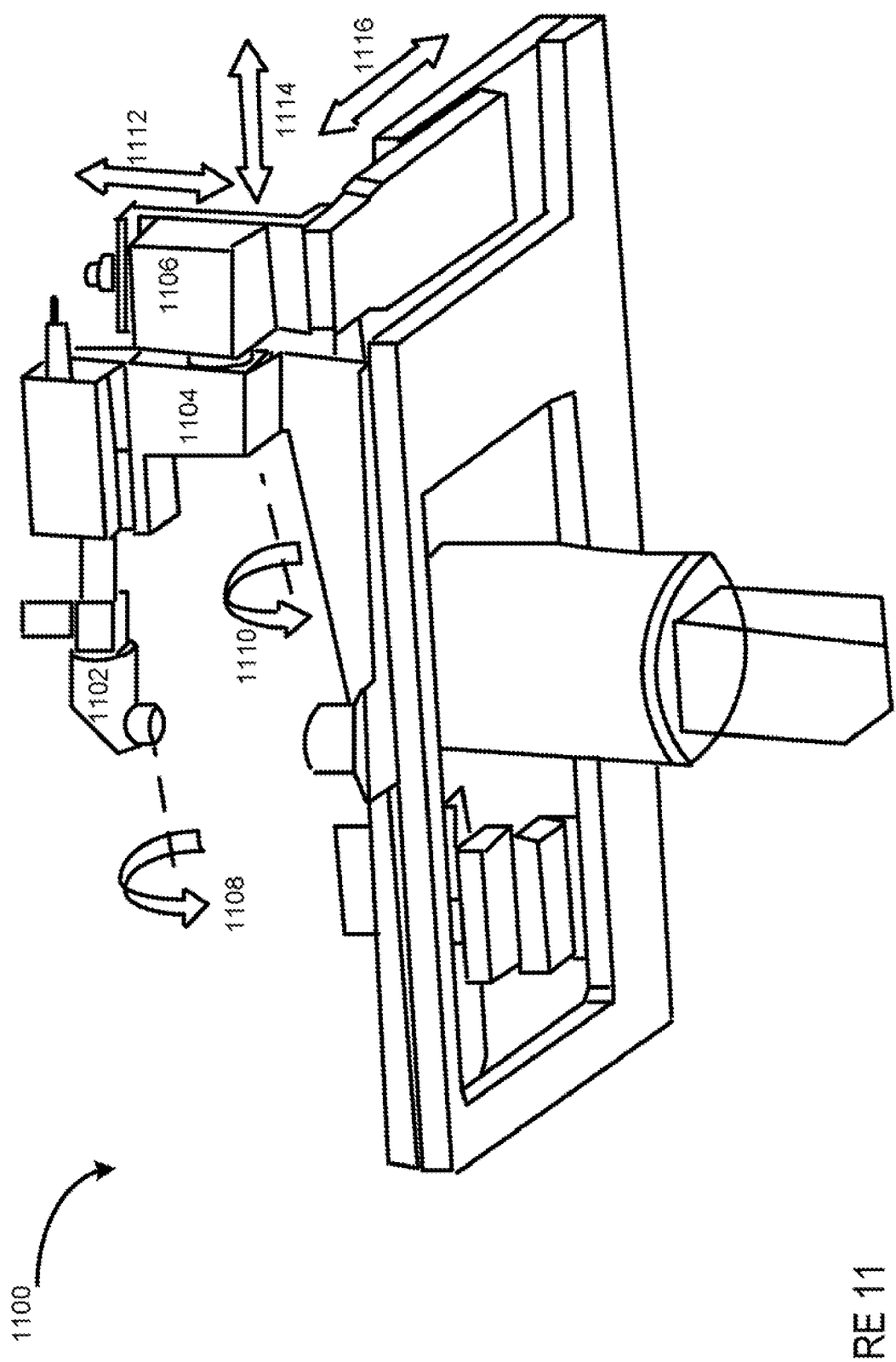
FIG. 11 shows, in an embodiment, a system diagram of a close-up view of a camera and optics enclosure on a camera mount.

FIG. 11 shows, in an embodiment, a system diagram of a close-tip view of a camera and optics enclosure on a camera mount. A BIM 1100 may include an optic enclosure 1102, which may be extended from a camera 1104. Camera, 1104 may be attached to a camera mount 1106.

In an embodiment camera mount 1106 may be extended in and out in the direction as shown by arrow 1116. By adjusting camera mount 1106, the position of camera 1104 and optics enclosure 1102 may be corrected to account for the size of the substrate and/or the size of the substrate area being analyzed. In an example, camera mount 1106 may have to be adjusted as the size of the substrate changes from 200 millimeters to 300 millimeters.

In an embodiment, camera 1104 may be moved in a vertical direction as shown by arrow 1112, enabling camera 1104 to capture images at different ranges. In another embodiment, camera 1104 may be moved in a lateral direction as shown by arrow 1114, enabling camera 1104 to further adjust for the size of the substrate and/or the size of the substrate area being analyzed. In yet another embodiment, camera 1104 may rotate as shown by arrow 1110 enabling camera 1104 to capture different views (e.g., top, bottom, and side) of the substrate. In an example, camera 1104 may be adjusted to capture a top view of the substrate. In another example, camera 1104 may be adjusted to capture a direct view of the bevel edge (e.g., side view) of the substrate.

In an embodiment, optics enclosure 1102 may also be adjusted. In an example, optics enclosure 1102 may rotate as shown by arrow 1108 enabling optics enclosure to provide lighting at different angles.

The ability of camera 1104, optics enclosure 1102, and camera mount 1106 to be adjusted provides BIM 1100 with the flexibility to capture images at different angles, ranges, and positions. Thus, controls of the type of images that may be captured may be refined. As aforementioned, the hardware of the BIM has been implemented with adjustable parts, thus providing flexibility in the positioning of the hardware.

Figure 12:
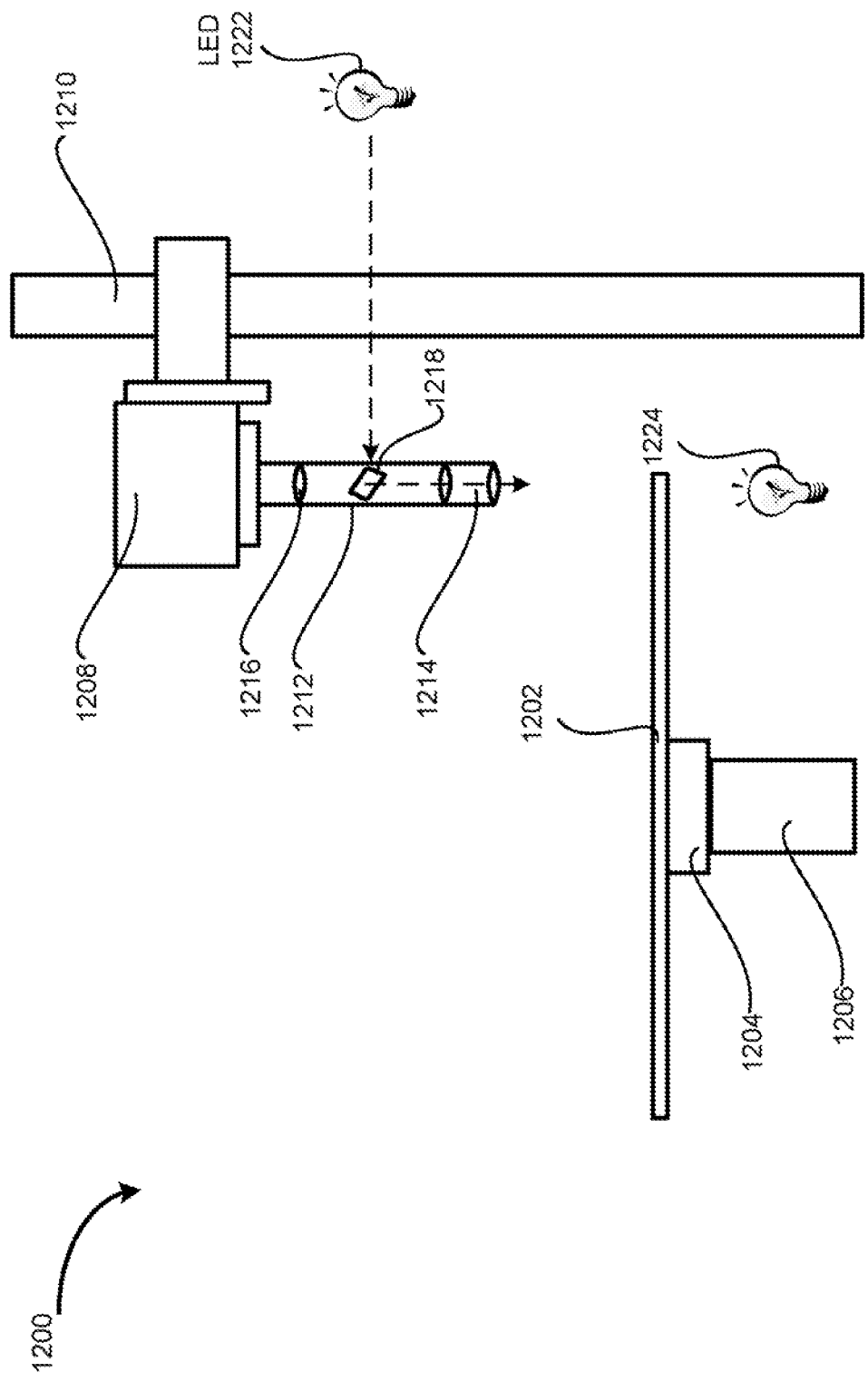
FIG. 12 shows, in an embodiment, a cross-sectional view of a BIM.

FIG. 12 shows, in an embodiment, a cross-sectional view of a BIM. Consider the situation wherein, images of a substrate are being taken. A BIM 1200 may include a substrate 1202 placed on top of a substrate chuck 1204. Substrate chuck 1204 may be connected to a rotational motor 1206, which may enable substrate 1202 to be rotated. The ability to rotate may allow substrate chuck 1204 to move substrate 1202 into position for a camera 1208 to capture images of substrate 1202 to capture images at different locations of substrate 1202.

BIM 1200 may also include a camera mount 1210. Attached to camera mount 1210 may include camera 1208 and an optics enclosure 1212. Optics enclosure 1212 may include a lens 1214, lens 1216, and a beam splitter 1218.

Lighting may be provided by a light 1222. In an embodiment, light 1222 may be a light-emitted diode (LED). In an embodiment, light 1222 may be a three wavelength LED. By having a plurality of wavelengths, the illumination may be changed as film thickness, profile, and/or index is change. In an example, to capture images of film with higher index, a shorter wavelength LED may be utilized. Light 1222 may flow from the outside into optics enclosure 1212 via beam splitter 1218, which may direct light 1222 downward towards lens 1214.

To increase the contrast between a substrate edge and the background, a backlight 1224 may be provided. Since a substrate may have bevel edges which may be rounded, light may bounce off the substrate, preventing a good image to be captured. In the prior art, no backlight may be provided, resulting in images in which the edges of a substrate may not be clearly defined. In an embodiment, BIM 1200 may include backlight 1224, which may help accentuate the edge of substrate 1202. By adding backlight 1224, contrast is provided between the edges of the substrate and the background. In other words, the edges of substrate 1202 may be illuminated enabling camera 1208 and optics enclosure 1212 to capture images of the edges of substrate 1202 that clearly separate the edges of the substrate from the background.

In an embodiment, the field of view of lens 1214 may be changed to increase or decrease the area being photographed by camera 1208. In addition, lens 1214 magnification may be changed. In an example, shorter wavelength LED may require a higher magnification in order to produce a clear image.

FIGS. 10, 11, and 12 show different views of a BIM. As can be seen, embodiments of the BIM provide an environment that is conducive to providing clear and sharp images that may be employed in fault detection. In an example, the BIM includes components that have the flexibility to be adjusted, to be moved, and/or to be rotated; thus, enabling the camera, optics enclosure, and substrate to be positioned such that clear images may be captured. Further, additional lightings may be provided, thus, enabling images that show contrast between the edges of a substrate and a background to betaken.

With the BIM, cleaner and sharper images may be produced allowing for fault detections to occur along the edges of a substrate. The next few figures will show how images captured by a BIM may be utilized to perform fault detections.

Figure 13:
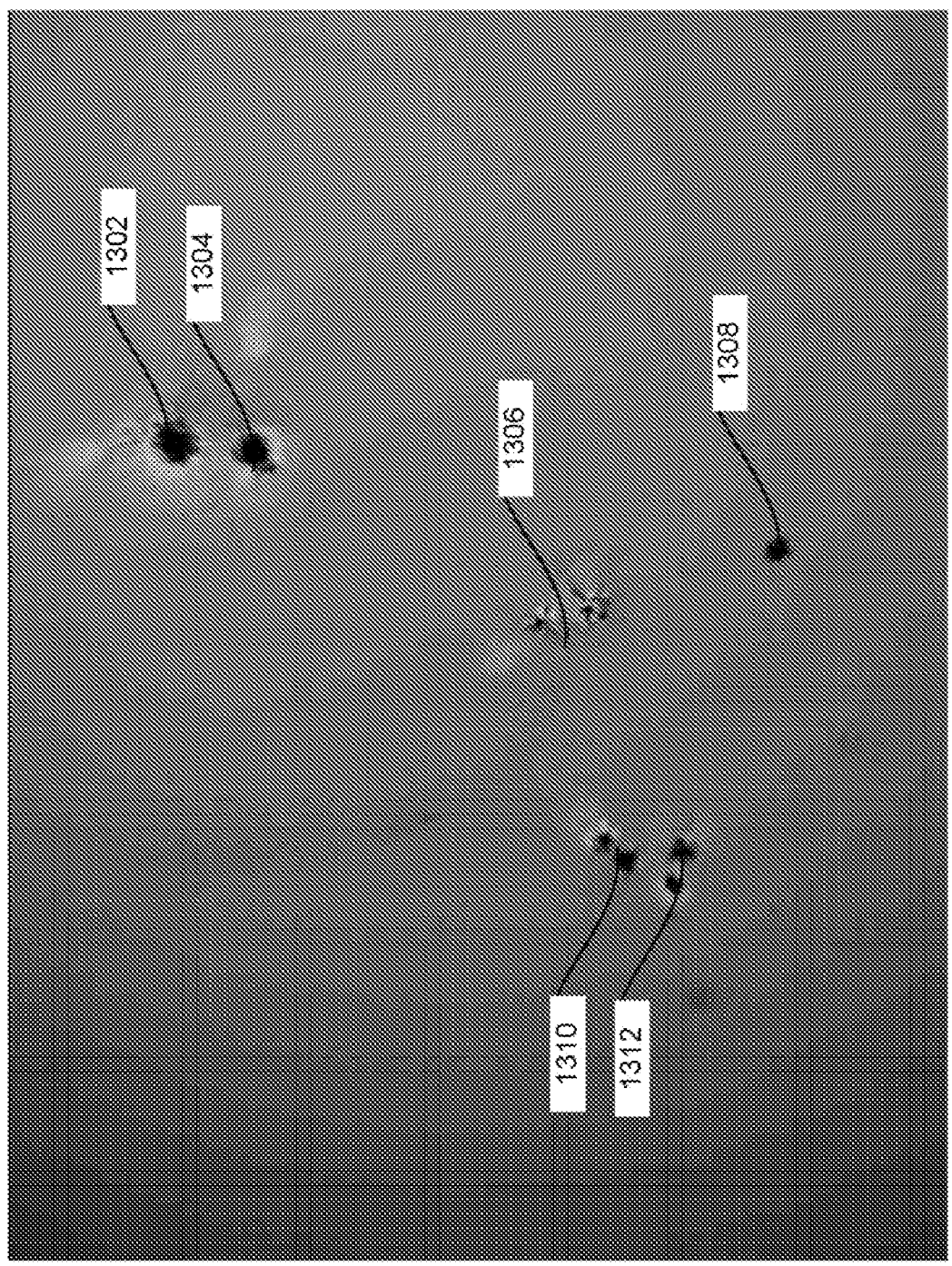
FIG. 13 shows, in an embodiment, an example of an image captured by a BIM that shows arcing occurring along the edges of a substrate.

In an embodiment, due to the clarity of images that may be produced by a BIM, defects along the edges of a substrate may now be detected. FIG. 13 shows, in an embodiment, an example of an image captured by a BIM that shows arcing occurring along the edges of a substrate. Image 1300 shows pit marks 1302, 1304, 1306, 1308, 1310, and 1312, which may be examples of arcing that may occur during processing. In the prior art, optical metrology tools may be employed to capture images of arcing that may be occurring away from the edges of a substrate. However, prior ail optical metrology tools generally do not have capability to capture clear images along the substrate edges. In order to identify defects, such as arcing, that may be occurring during substrate processing along the edges. BIM may be employed to capture sharp clear images of the edges of the substrate.

Figure 14:
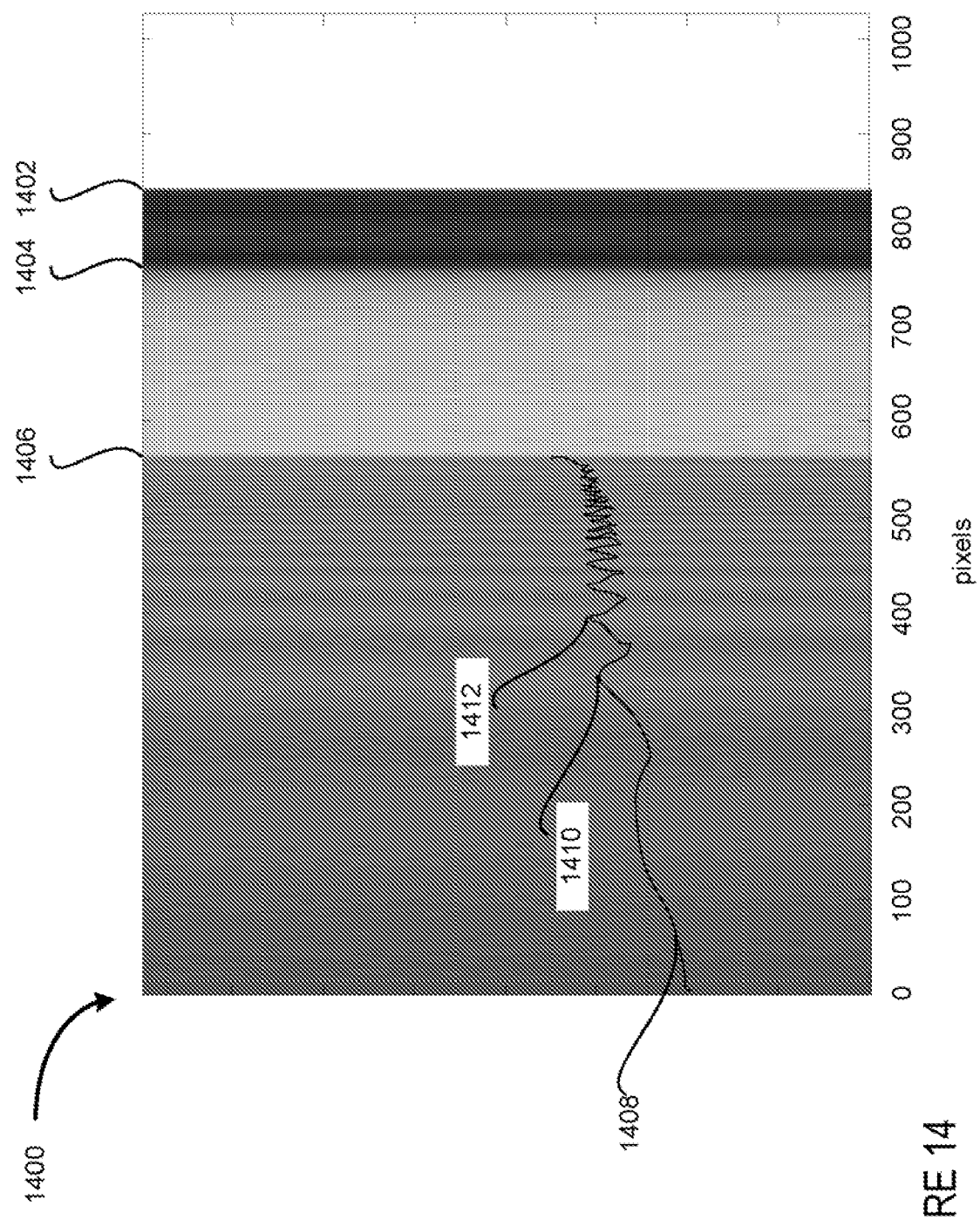
FIG. 14 shows, in an embodiment, an example of an image produced by BIM that may be utilized in identifying misalignment.

FIG. 14 shows, in an embodiment, an example of an image produced by BIM that may be utilized in identifying misalignment. Image 1400 shows an image of an area of a substrate edge. A line 1402 may represent the edge of a substrate. A line 1404 may represent the last point at which the substrate may be flat. A line 1406 may represent the point where the film layer has been totally removed. Curve 1408 may represent the plurality of interference fringes (e.g.. 1410, 1412) that may occur during processing. Each interference fringe may represent the distance from the edge of a substrate in which the etch rate may be constant.

If the distance from line 1406 to line 1402 is substantially the same at different orientations (θ), then the substrate is substantially centered in the processing chamber and misalignment is minimal or substantially zero. However, if the distance from edge of substrate, which is from line 1402 to line 1406, is not the same at different orientations (θ), then misalignment may exist. By plotting a plurality of distances from edge of substrate versus orientations (θ), an off-centered plot may be created. If additional off-centered plot is desired, then line 1406 may be replaced by one of the interference fringes. In an example, an off-centered plot may be created for a plurality of distances from the edge of a substrate from line 1402 to interference fringe 1412.

Figure 15:
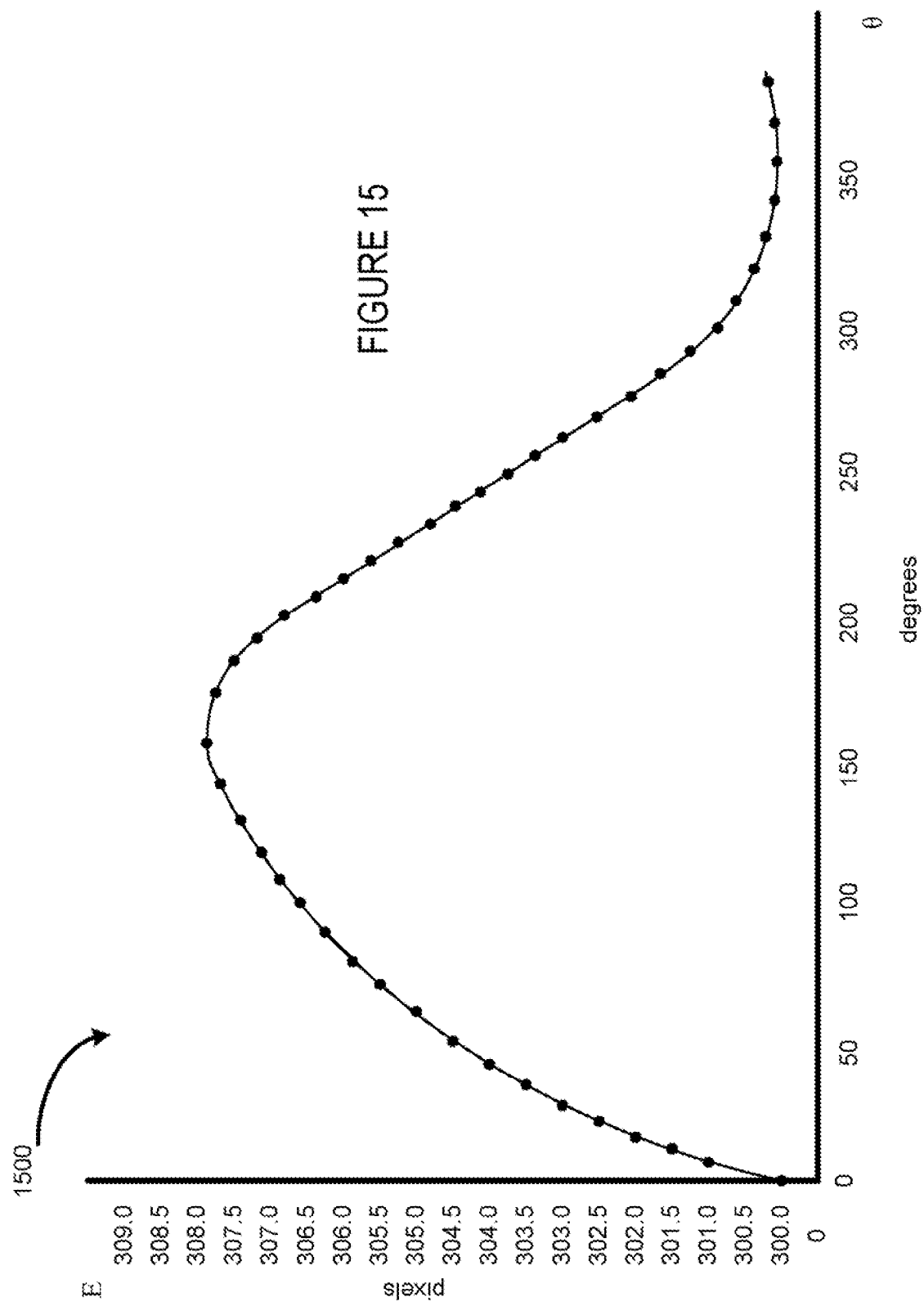
FIG. 15 shows, in an embodiment, a simple graph illustrating distance from center versus orientation of a constant etch rate.

FIG. 15 shows, in an embodiment a simple graph illustrating an off-centered plot (i.e., distance from center versus orientation of a constant etch rate).

A graph view 1500 shows a plurality of distances from edge of substrate (E) plotted versus a plurality of orientations (θ). As can be seen, FIG. 15 is similar to FIG. 5. The main difference is that in FIG. 15, the distance is from the edge of a substrate instead of from the center of a substrate. For each interference fringe, an off-centered plot may be plotted. The off-centered plot, in an embodiment, may have a substantially sinusoidal shape. In an embodiment, a process center may be calculated from at least one off-centered plot.

Once an off-centered plot has been plotted, a curve-fitting equation (e.g., Fourier Series Equation from Fourier Transform, Least Square Fit, etc) may be employed to determine the parameters for Equation 2.

$$E_n(\theta) = E_{avg} + \Delta c \cos(\theta - \phi_1) + \Delta c_2 \cos(2\theta - \phi_2) \qquad \text{[EQUATION 2]}$$

| Parameter | Description |
| --- | --- |
| $E_{avg}$ | average distance from edges of a substrate for a interference fringe |

-continued

| Parameter | Description |
| --- | --- |
| $\Delta c \cos(\theta-\phi_1)$ | first harmonics - deviation as a function of an orientation |
| $\Delta c_2 \cos(2\theta-\phi_2)$ | second harmonics |
| $\Delta c$ | distance measurement between 2 centers |
| $\theta$ | orientation |
| $\phi$ | angle of which the offset is in |

Figure 16:
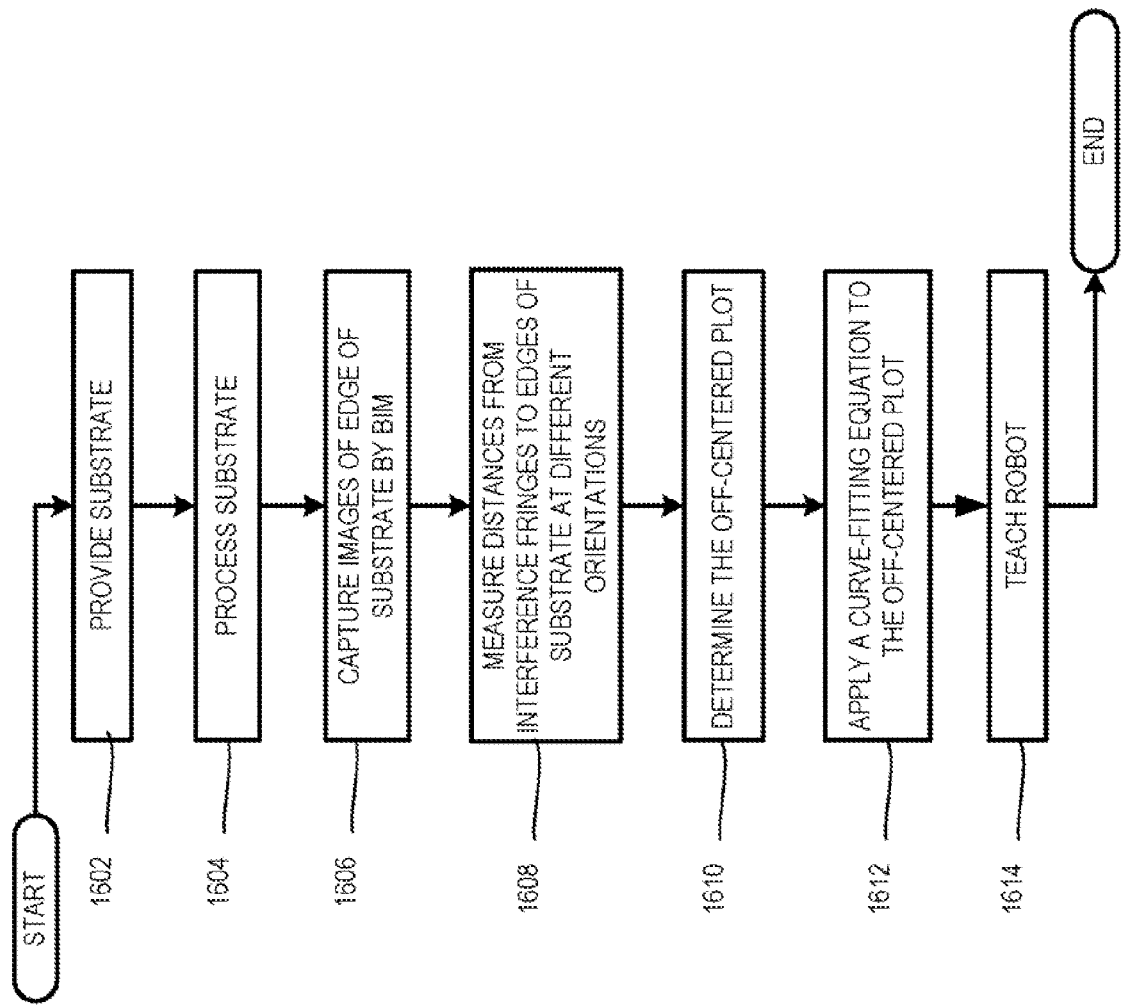
FIG. 16 shows, in an embodiment, a simple flow chart illustrating the steps for calculating a process center for a substrate chuck utilizing images captured by a BIM.

FIG. 16 shows, in an embodiment, a simple flow chart illustrating the steps for calculating a process center for a substrate chuck utilizing images captured by a BIM.

At a first step 1602, a substrate is provided In an embodiment, the substrate may have a film layer (e.g., refractive film layer).

At a next step 1604, an area at the edges of the substrate may be processed in a plasma processing chamber. In an example, the area that may be processed does not include the substrate section that is beyond 3 millimeters from the edges of the substrate.

Once the substrate has been, removed from, the plasma processing chamber, at a next step 1606, the BIM may capture a plurality of images of the processed area of the substrate.

At a next step 1608, a plurality of distances from the edges of the substrate for an interference fringe may be measured at different orientations.

At a next step, 1610, the plurality of distances from the edges of the substrate may be plotted against the orientations ($\theta$) to create an off-centered plot. An off-centered plot may be plotted for each interference fringe, although a substrate offset may be determined by one off-centered plot.

At a next step 1612, a curve-fitting equation (e.g., Fourier Series Equation from Fourier Transform, Least Square Fit, etc.) may be employed to determine the parameters for the substrate offset. Those skilled in the art are familiar with curve-fitting equation. As a result, no further discussion will be provided. Once the parameters have been determined for the above Equation 2, at a final step 1614, the parameters may be taught to a robotic arm in a transfer module (e.g., vacuum transfer module, atmospheric transfer module, and the like). As a result, the robotic arm may now have the correct coordinates to offset a substrate on a substrate chuck such that the substrate may be guided into the process center of the substrate chuck.

Figure 17:
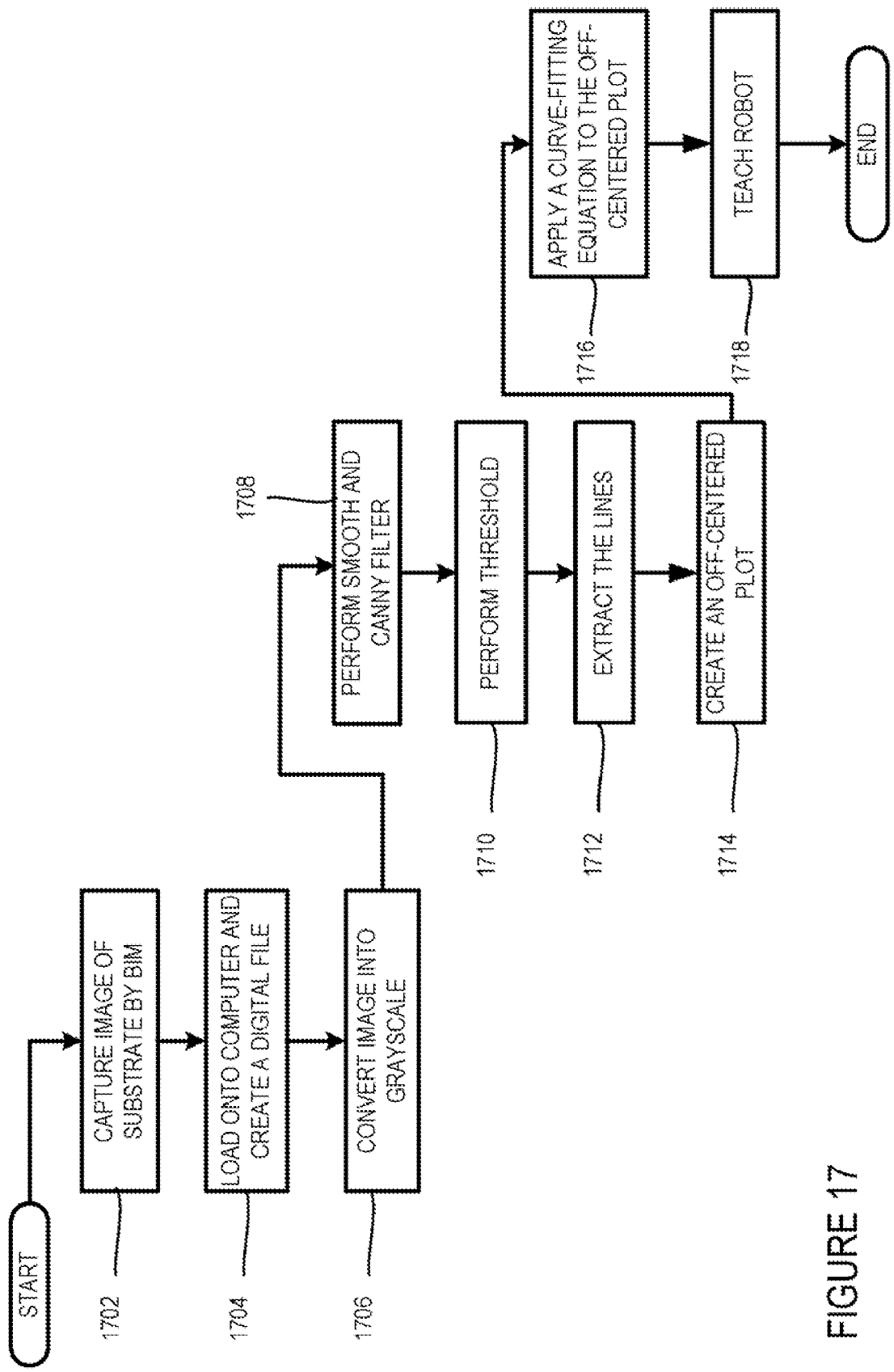
FIG. 17 shows, in an embodiment, an image processing flowchart for manipulating images that are captured by a BIM for performing fault detection.

FIG. 17 shows, in an embodiment, an image processing flowchart, for manipulating images that are captured by a BIM for performing fault detection.

At a first step 1702, a BIM may capture an image of a substrate. In an embodiment, the image may be in color.

At a next step 1704, the image may be uploaded onto a computer system and a digital file of the image may be produced.

At a next step 1706, the image may be converted into a grayscale image, which is usually an 8 bits image.

At a next step 1708, smooth and canny may be performed. Smooth and canny refers to a filtering technique in which noises may be removed from the image and edges of the image may be accentuated.

Figure 18:
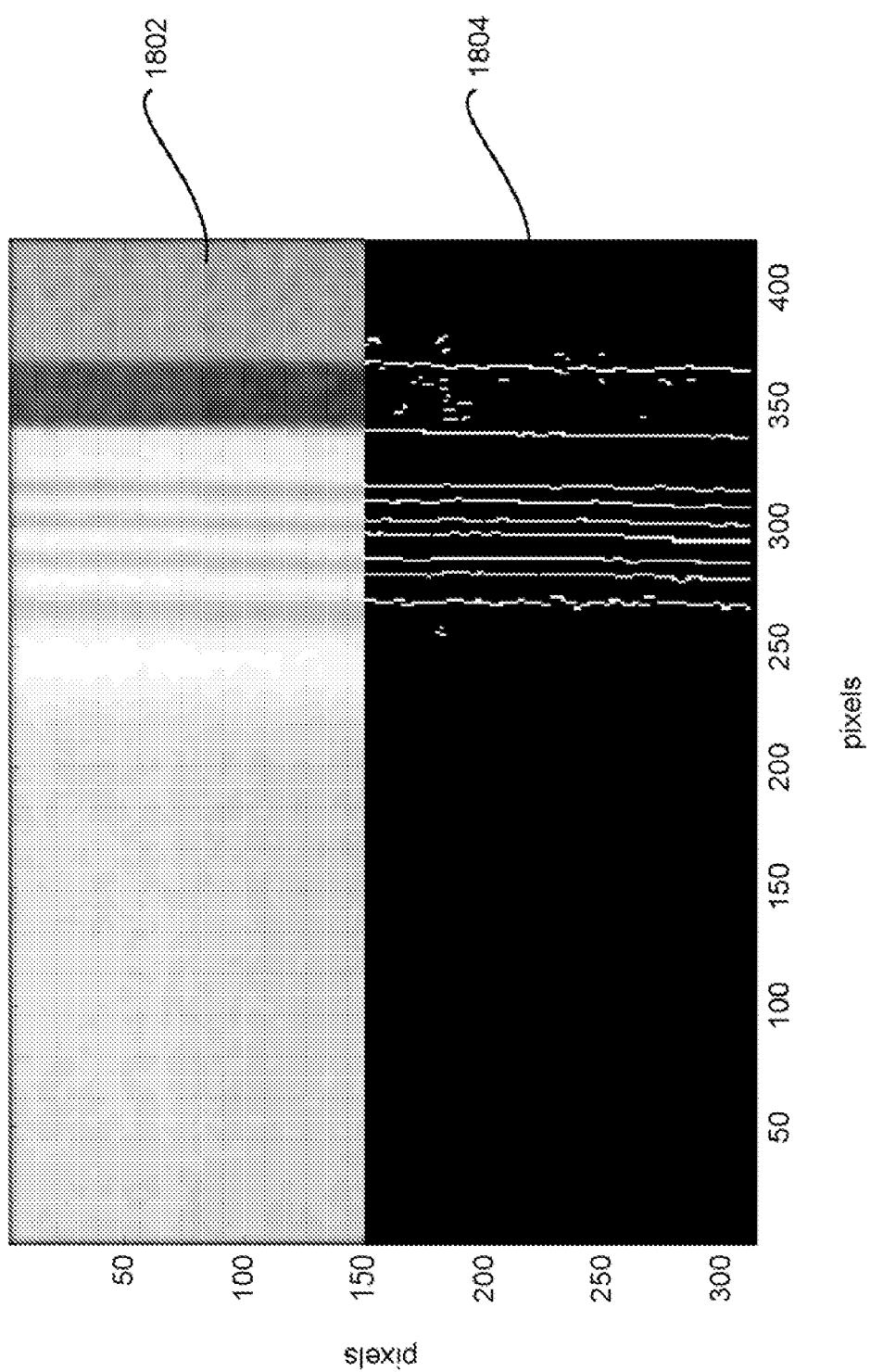
FIG. 18 shows, in an embodiment, an example of an image captured by a BIM that shows threshold.

At a next step 1710, threshold may be performed. Threshold refers to converting the image from an 8 bits image to a 1 bit image. In other words, only the edges of the image may now be seen. See FIG. 18 for an example of an image captured by a BIM that, shows threshold. Area 1802 may represent an image of a substrate prior to processing. Area 1804 may represent an image of a substrate after threshold has been performed. As can be seen from the image, all but the edges of the interference fringes, film thickness, and bevel edges may be eliminated. In an embodiment, additional filtering may be performed to remove additional noises that may exist in the image until only the lines for the bevel edge and the first interference fringe remains.

At a next step 1712, the line may be extracted and the gap may be calculated to determine the distance from the edge of the substrate. As discussed herein, the gap refers to the distance between the edge of a substrate and the first interference fringe. Steps 1702 through 1712 may be repeated for images at different orientations. In an embodiment, the gap data may be extracted for at least four different orientations.

At a next step 1714, the plurality of gaps may be plotted against the orientation to create an off-centered plot, which may be a sinusoidal curve.

At a next step 1716 a curve-fitting equation (e.g., Fourier Series Equation from Fourier Transform, Least Square Fit, etc.) may be employed to determine the parameters for the substrate offset.

At a final step 1718, the parameters for an adjusted process center may be taught to a robotic arm in a transfer module (e.g., atmospheric transfer module, vacuum transfer module, etc.).

Figure 19:
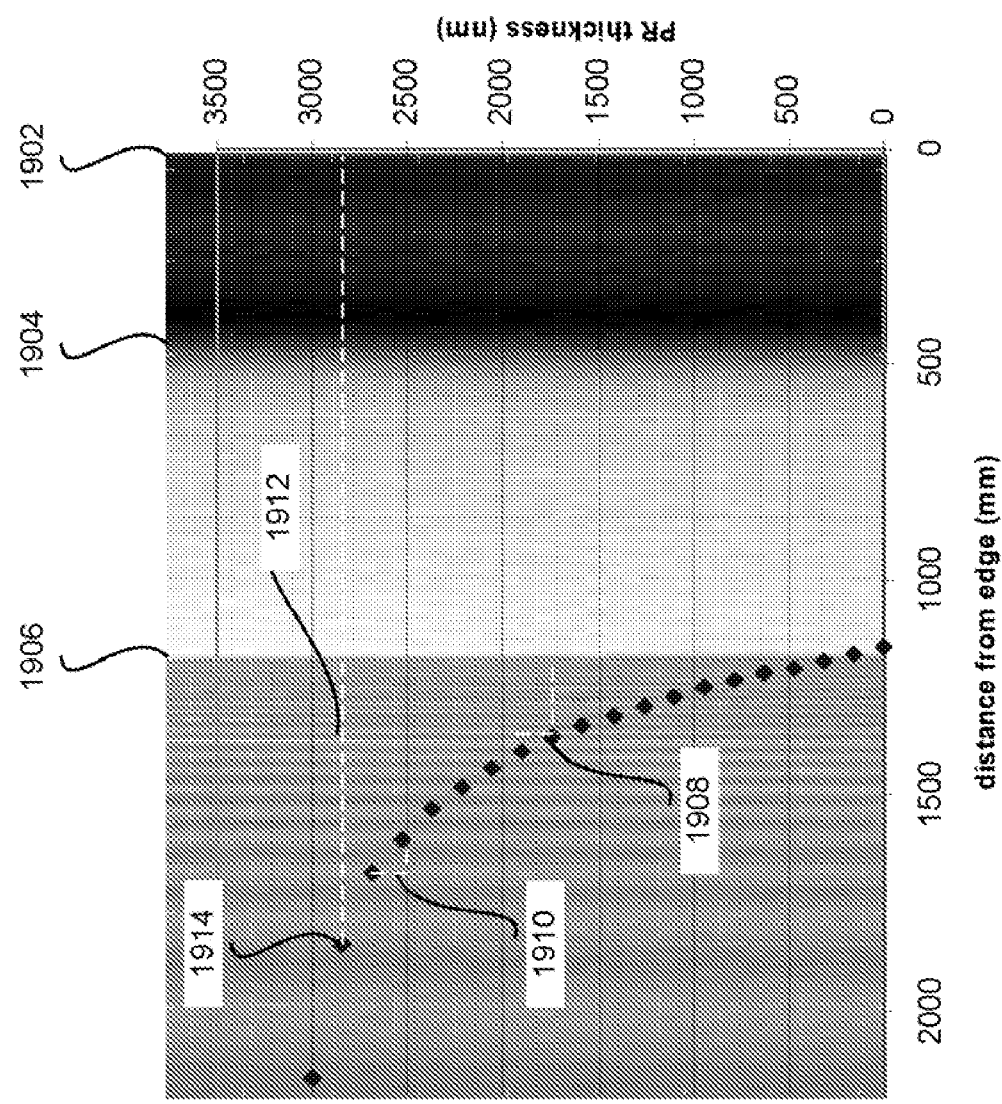
FIG. 19 shows, in an embodiment, an example of an image of a substrate with interference fringes that is captured by a BIM.

FIG. 19 shows, in an embodiment, an example of an image of a substrate with interference fringes that is captured by a BIM. A line 1902 may represent the edge of a substrate. From a line 1904 to a line 1906, the film layer may have been cleared during processing. Curve 1908 may represent the plurality of interference fringes that may occur during processing. As discussed herein, interference fringe refers to the maxima or the minima of the amplitude of reflective light. Equation 3 below may be utilized to calculate the thickness between two consecutive interference fringes.

$$\Delta t = \lambda 2n \qquad \text{[Equation 3]}$$

| Parameter | Description |
| --- | --- |
| $\Delta t$ | Changes between two consecutive interference fringes |
| $\lambda$ | Wavelength |
| n | Index of the film |

The thickness change in two consecutive interference fringes may be calculated because both the wavelength and the index are known variables. The wavelength is associated with the wavelength of the LED that may be employed to capture the image in a BIM. The index of the film is known and is dependent upon the type of film that may be applied to a substrate. In an example, the wavelength is 500 nanometers and the index is 2.5. The thickness change for this example is 100 nanometers. In other words, the thickness between interference fringes (1910) is 100 nanometers each.

For each interference fringe, a distance from the edge of the substrate may be calculated. In an example, a distance from the edge of the substrate (1912) for an interference fringe 1914 is about 1875 millimeter. Thus, curve 1908 may represent a thickness profile for the substrate at a specific orientation.

In an embodiment, the thickness profile may be converted into an etch depth profile. Since the thickness of the film layer is known, the thickness change ($\Delta t$) may he subtracted from the original film thickness to determine the etch depth. For each thickness change, an etch depth may be calculated. Once the etch depths have been identified, the aforementioned inventive circular constant etch method may be employed to determine the substrate offset and ultimately the process center of a substrate chuck for a processing chamber.

As can be appreciated from embodiments of the invention, the BIM provides an inline inspection tool that is capable of capturing dear and sharp images of the bevel edges of a substrate without sacrificing the substrate. With dear and sharp images, fault detections may be performed along the bevel edge, allowing misalignment and defects in the substrate to be identified and resolved. In addition, the ability to perform, fault detection enables better control of the processing that may occur along the edges of a substrate. Further, by eliminating the substrate from the equation, a more accurate characterization of chamber performance may be achieved.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods arid apparatuses of the present invention. It is therefore intended that the following appended claims be interpreted as including all such alterations, permutations, and equivalents as fell within the true spirit and scope of the present invention.

What is claimed is:

1. A method for aligning a substrate to a process center of a support mechanism, wherein said process center representing a focal center for processing said substrate in a plasma processing chamber, comprising:
   determining a plurality of thickness values for said substrate after substrate processing at a plurality of orientations and at a plurality of radial distances from a geometric center of said substrate;
   deriving a set of process rate values from said plurality of thickness values and a process duration;
   creating an off-centered plot for a first process rate of said set of process rate values, wherein said off-centered plot represents a substantially concentric circle whose points on a circumference of said off-centered plot having substantially said first process rate;
   applying a curve-fitting equation to said off-centered plot to determine a set of parameters for offsetting said substrate in relation to said support mechanism; and
   teaching a set of robot arms said set of parameters, thereby enabling said set of robot arms to align another substrate that is supported by said support mechanism with said process center of said support mechanism when said set of robot arms positions said another substrate in said plasma processing chamber for processing.

2. The method of claim 1 wherein said plurality of thickness values is determined by identifying a set of data points, wherein said set of data points includes pre-processing data points and post-processing data points.

3. The method of claim 1 wherein said plasma processing chamber is one of a deposition chamber and a cleaning chamber.

4. The method of claim 1 wherein said first process rate is one of a deposition rate and a cleaning rate.

5. The method of claim 1 wherein said curve-fitting equation is a Fourier Series Equation from Fourier Transform.

6. The method of claim 1 wherein said curve-fitting equation is a Least Square Fit on a sinusoidal curve.

7. The method of claim 1 wherein said off-centered plot is a sinusoidal curve.

8. A method for aligning a substrate to a process center of a support mechanism, wherein said process center representing a focal center for processing said substrate in a plasma processing chamber, comprising:
   identifying a set of data points, wherein said set of data points includes a plurality of thickness values for said substrate at a plurality of orientations and at a plurality of radial distances from a geometric center of said substrate;
   processing said set of data points to calculate a set of parameters for determining said process center of said support mechanism; and
   teaching a set of robot arms said set of parameters, thereby enabling said set of robot arms to align another substrate that is supported by said support mechanism with said process center of said support mechanism when said set of robot arm s positions said another substrate in said plasma processing chamber for processing, wherein a metrology tool is employed to generate said plurality of radial distances from said neometric center of said substrate.

9. The method of claim 8 wherein said processing of said set of data points includes
   calculating deposition depth values by determining differences between said post-processing data points and said pre-processing data points,
   deriving a set of deposition rate values from said deposition depth values and a process duration,
   generating thickness profiles for said plurality of orientations,
   extrapolating a set of radiuses from said thickness profiles,
   creating an off-centered plot for a first deposition rate of said set of deposition rate values, wherein said off-centered plot represents a substantially concentric circle whose points on a circumference of said off-centered plot having substantially said first deposition rate, and
   applying a curve-fitting equation to said off-centered plot to determine said set of parameters for offsetting said substrate in relation to said support mechanism.

10. The method of claim 8 wherein processing said set of data points includes
    calculating density depth values by determining differences between said post-processing data points and said pre-processing data points,
    deriving a set of cleaning rate values from said density depth values and a process duration,
    generating thickness profiles for said plurality of orientations,
    extrapolating a set of radiuses from said thickness profiles,
    creating an off-centered plot for a first cleaning rate of said set of cleaning rate values, wherein said off-centered plot represents a substantially concentric circle whose points on a circumference of said off-centered plot having substantially said first cleaning rate, and
    applying a curve-fitting equation to said off-centered plot to determine said set of parameters for offsetting said substrate in relation to said support mechanism.

11. The method of claim 8 wherein said plurality of thickness values is determined by identifying pre-processing data points and post-processing data points, wherein said pre-processing data points and said post-processing data points are generated using a scan pattern.

12. The method of claim 9 wherein said curve-fitting equation is one of a Fourier Series Equation from Fourier Transform and a Least Square Fit on a sinusoidal curve.

13. The method of claim 10 wherein said curve-fitting equation is one of a Fourier Series Equation from Fourier Transform and a Least Square Fit on a sinusoidal curve.

14. An article of manufacture comprising a non-transitory program storage medium having computer readable code embodied therein, said computer readable code being configured for aligning a substrate to a process center of a support mechanism, wherein said process center representing a focal center for processing said substrate in a plasma processing chamber, comprising:
   computer readable code determining a plurality of thickness values for said substrate after substrate processing at a plurality of orientations and at a plurality of radial distances from a geometric center of said substrate;
   computer readable code deriving a set of process rate values from said plurality of thickness values and a process duration;
   computer readable code creating an off-centered plot for a first process rate of said set of process rate values, wherein said off-centered plot represents a substantially concentric circle whose points on a circumference of said off-centered plot having substantially same first process rate;
   computer readable code applying a curve-fitting equation to said off-centered plot to determine a set of parameters for offsetting said substrate in relation to said support mechanism; and
   computer readable code teaching a set of robot arms said set of parameters, thereby enabling said set of robot arms to align another substrate that is supported by said support mechanism with said process center of said support mechanism when said set of robot arms positions said another substrate in said plasma processing chamber for processing.

15. The article of manufacture of claim 14 wherein said plurality of thickness values is determined by including a computer readable code for identifying a set of data points, wherein said set of data points include pre-processing data points and post-processing data points.

16. The article of manufacture of claim 14 wherein said plasma processing chamber is one of a deposition chamber and a cleaning chamber.

17. The article of manufacture of claim 14 wherein said first process rate is one of a deposition rate and a cleaning rate.

18. The article of manufacture of claim 14 wherein said curve-fitting equation is one of a Fourier Series Equation from Fourier Transform and a Least Square Fit on a sinusoidal curve.

19. The article of manufacture of claim 14 wherein said off-centered plot is a sinusoidal curve.

\* \* \* \* \*